(12) United States Patent
Umezawa et al.

(10) Patent No.: US 11,275,124 B2
(45) Date of Patent: Mar. 15, 2022

(54) ABNORMALITY CAUSE IDENTIFYING METHOD, ABNORMALITY CAUSE IDENTIFYING DEVICE, POWER CONVERTER AND POWER CONVERSION SYSTEM

(71) Applicant: FUJI ELECTRIC CO., LTD., Kanagawa (JP)

(72) Inventors: Kazuyoshi Umezawa, Hyogo (JP); Satoshi Ishida, Hyogo (JP); Motohiro Tsukuta, Hyogo (JP); Yasuyuki Noto, Hyogo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 118 days.

(21) Appl. No.: 16/726,442

(22) Filed: Dec. 24, 2019

(65) Prior Publication Data
US 2020/0256926 A1    Aug. 13, 2020

(30) Foreign Application Priority Data
Feb. 12, 2019   (JP) .............................. JP2019-023035

(51) Int. Cl.
*G01R 31/42*        (2006.01)

(52) U.S. Cl.
CPC ................... *G01R 31/42* (2013.01)

(58) Field of Classification Search
CPC ........ G01R 31/42; G01R 31/52; G01R 31/40; G01R 19/2513
See application file for complete search history.

(56) References Cited

U.S. PATENT DOCUMENTS

| | | | |
|---|---|---|---|
| 10,599,201 B1* | 3/2020 | Bonen | G06F 11/00 |
| 2010/0076612 A1* | 3/2010 | Robertson | G06F 19/00 700/286 |
| 2015/0109836 A1* | 4/2015 | Hatakeyama | H02M 7/537 |
| 2016/0127924 A1* | 5/2016 | Lee | H04W 24/02 |
| 2020/0242566 A1* | 7/2020 | Agarwa | G06Q 10/10 |
| 2020/0293789 A1* | 9/2020 | Ito | G06K 9/00 |

FOREIGN PATENT DOCUMENTS

JP    2018-044938    3/2018

\* cited by examiner

*Primary Examiner* — Tarun Sinha
*Assistant Examiner* — Lal C Mang
(74) *Attorney, Agent, or Firm* — IPUSA, PLLC

(57) ABSTRACT

An abnormality cause identifying method that is applied to a computer is provided. The abnormality cause identifying method includes: outputting a control parameter that is calculated based on a detection value detected from a power converter that converts power supplied from a power supply and supplies the converted power to a load; plotting, on coordinates having at least two axes, a value that is calculated using the detection value and the control parameter; and identifying an abnormality cause based on a quadrant of the coordinates on which the value is plotted.

19 Claims, 32 Drawing Sheets

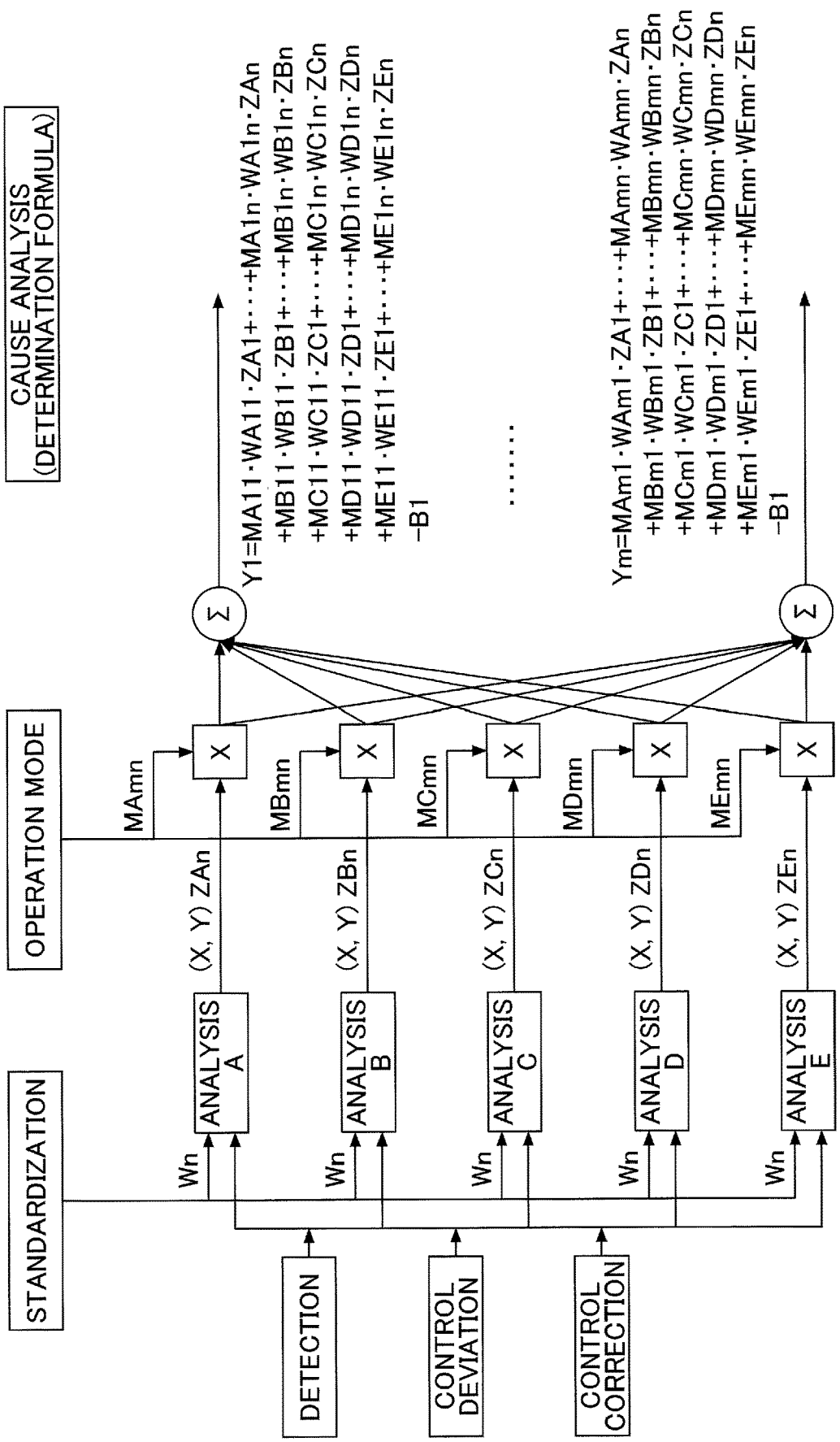

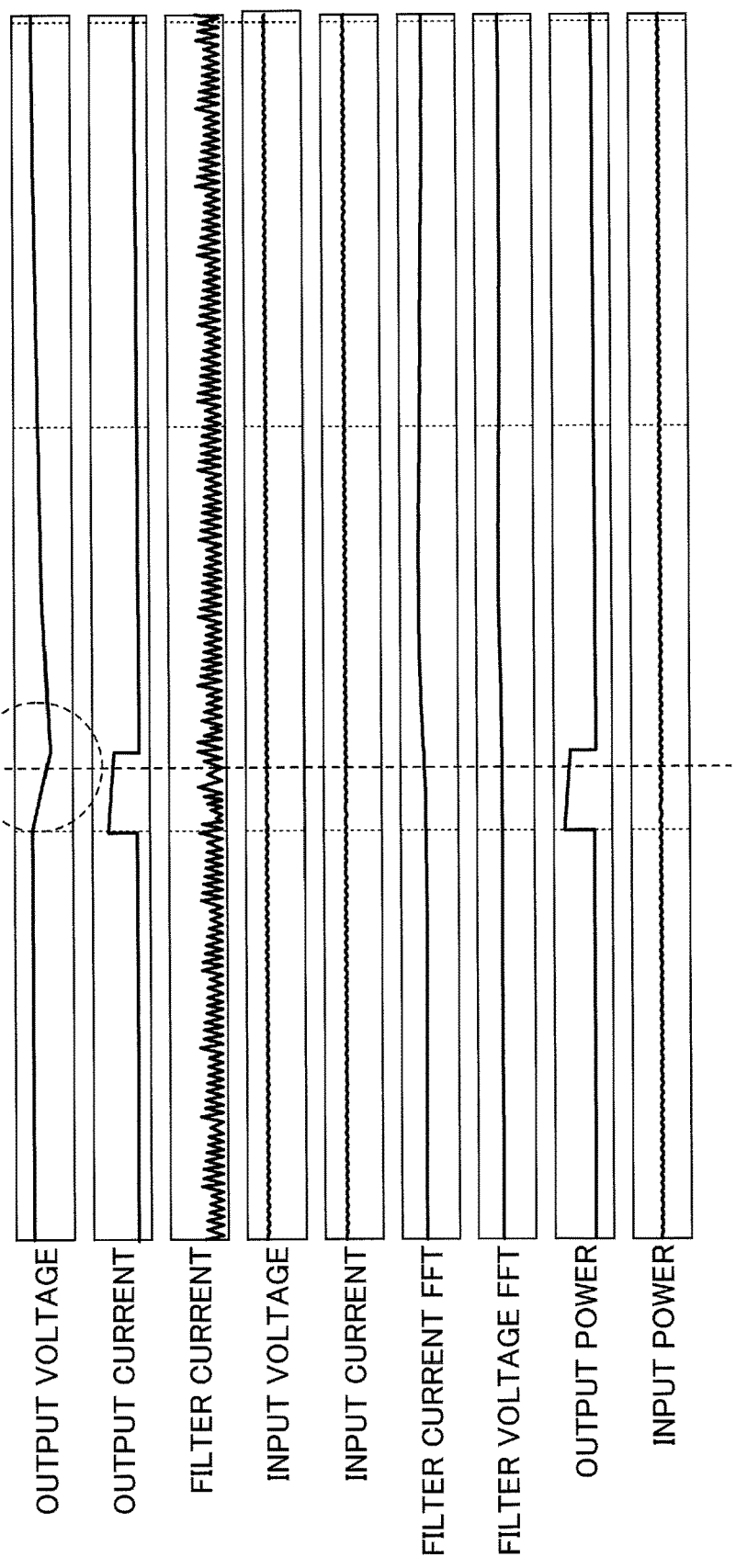

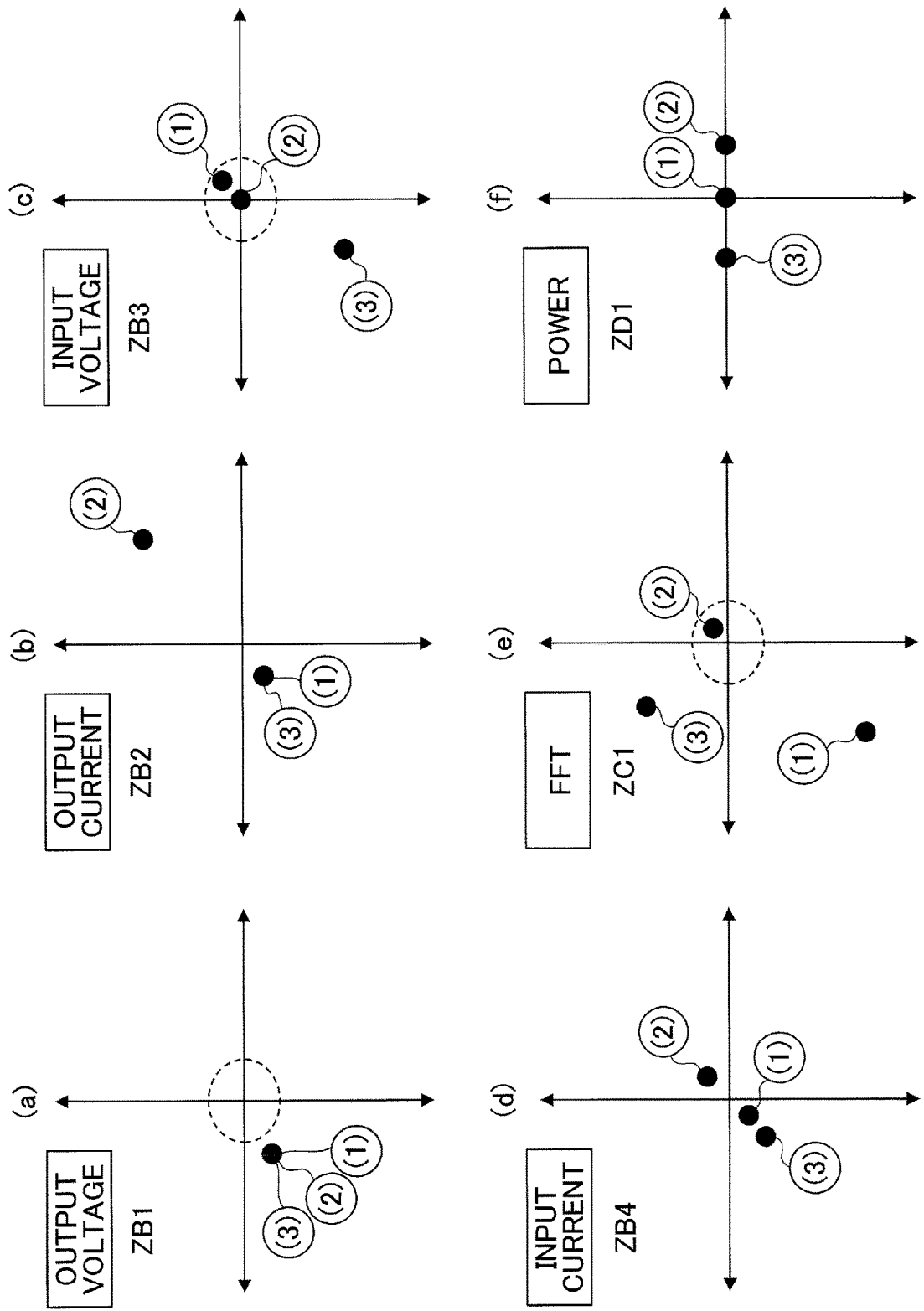

FIG.24B (a)

| CAUSE ANALYSIS EXAMPLE \ MODE PARAMETER | MB1 | MB2 | MB3 | MB4 | MC1 | MD1 |
|---|---|---|---|---|---|---|
| (1) SWITCHING ELEMENT DRIVE SYSTEM | −1 | −1 | 1 | −1 | −1 | 0 |
| (2) LOAD SYSTEM | −1 | 1 | −1 | 1 | 1 | 1 |
| (3) INPUT VOLTAGE SYSTEM | −1 | −1 | −1 | −1 | 0 | −1 |

(b)

| CAUSE \ INPUT | ZB1 | ZB2 | ZB3 | ZB4 | ZC1 | ZD1 | B1 |
|---|---|---|---|---|---|---|---|
| (1) SWITCHING ELEMENT DRIVE SYSTEM | −3.0 | −1.0 | 0.0 | −1.0 | −18.0 | −0.5 | 12.0 |
| (2) LOAD SYSTEM | −3.0 | 10.0 | 0.0 | 1.0 | 0.0 | 4.0 | 12.0 |
| (3) INPUT VOLTAGE SYSTEM | −3.0 | −1.0 | −10.0 | −2.0 | −6.0 | −2.0 | 12.0 |

FIG.24C

EXAMPLE OF CAUSE DETERMINATION FORMULA $Y = MB1 \cdot ZB1 + MB2 \cdot ZB2 + MB3 + MB4 \cdot ZB3 + MB4 \cdot ZB4 + MC1 \cdot ZC1 + MD1 \cdot ZD1 - B1$

DEGREE OF CAUSE IS POSITIVE WHEN Y>0

| DETERMINATION FORMULA | CAUSE (Z) | SWITCHING ELEMENT DRIVE SYSTEM | LOAD SYSTEM | INPUT VOLTAGE SYSTEM |
|---|---|---|---|---|
| (1) | SWITCHING ELEMENT DRIVE SYSTEM | 11.5 | -20.0 | -10.0 |
| (2) | LOAD SYSTEM | -29.5 | 6.0 | -10.0 |
| (3) | INPUT VOLTAGE SYSTEM | -6.5 | -24.0 | 6.0 |

ABNORMALITY CAUSE IDENTIFYING METHOD, ABNORMALITY CAUSE IDENTIFYING DEVICE, POWER CONVERTER AND POWER CONVERSION SYSTEM

BACKGROUND OF THE INVENTION

Field of the Invention

The present invention relates to an abnormality cause identifying method and an abnormality cause identifying device, a power converter including the abnormality cause identifying device, and a power conversion system.

Background of the Invention

When an abnormality occurs in a power converter, it is necessary to recover from it quickly. Further, in an arrangement in which multiple power converters are connected in parallel, when an abnormality occurs in one of the multiple power converters, operations of normally operating power converters are adversely affected, and thus, reliability of the entire system may be reduced. Further, when an abnormality occurs in external environments of the power converter such as a power reception device that supplies power to the power converter, load equipment that is connected to the power converter, etc., operations of the power converter may be affected by the abnormality. Therefore, it is necessary to quickly analyze and identify an abnormality cause, and to take measures to remedy the situation. Patent Document 1 describes a technique for detecting device failure symptoms of an apparatus and determining an abnormality of the apparatus itself.

CITATION LIST

Patent Document

[Patent Document 1] Japanese Unexamined Patent Application Publication No. 2018-44938

SUMMARY OF THE INVENTION

Technical Problem

However, in the case where an abnormality determination method described in Patent Document 1 is used, it may not be possible to identify a cause of an abnormality that does not lead to the failure of the power converter, and it may not be possible to distinguish whether the abnormality is caused by the power converter itself or the abnormality is caused by external environments of the power converter. Therefore, when an abnormality that does not lead to the failure of the power converter occurs or an abnormality that is caused by external environments of the power converter occurs, abnormality indication information indicating that some abnormality has occurred is provided to a user, and thus, it becomes necessary to manually perform investigation for identifying an abnormality cause. As a result, significant efforts may be required to identify an abnormality cause, which may lead to a problem with significant amount of cost.

In view of the above, it is an object of the present invention to provide an abnormality cause identifying method that enables to identify an abnormality cause easily.

Solution to Problem

According to an embodiment of the present invention, an abnormality cause identifying method that is applied to a computer is provided. The abnormality cause identifying method includes: outputting a control parameter that is calculated based on a detection value detected from a power converter that converts power supplied from a power supply and supplies the converted power to a load; plotting, on coordinates having at least two axes, a value that is calculated using the detection value and the control parameter; and identifying an abnormality cause based on a quadrant of the coordinates on which the value is plotted.

According to an embodiment of the present invention, an abnormality cause may be identified easily.

BRIEF DESCRIPTION OF THE DRAWINGS

FIG. 22A is a first drawing illustrating a flow of cause determination processing performed by the cause identifying unit 55.

FIG. 23B is a second drawing illustrating waveforms in the case where a decreasing change occurs in an output voltage, using, as an example, a power converter controlling a direct current voltage to a constant value.

FIG. 24A is a first drawing illustrating a sequential flow of cause determination processing in the case where the change of the output voltage occurs as illustrated in FIG. 23.

FIG. 24B is a second drawing illustrating a sequential flow of cause determination processing in the case where the change of the output voltage occurs as illustrated in FIG. 23.

FIG. 24C is a third drawing illustrating a sequential flow of cause determination processing in the case where the change of the output voltage occurs as illustrated in FIG. 23.

DETAILED DESCRIPTION OF THE PREFERRED EMBODIMENTS

In the following descriptions, an abnormality cause identifying method, an abnormality cause identifying device, a power converter and a power conversion system according to an embodiment of the present invention will be described in detail based on the drawings. It should be noted that the present invention is not limited by the following embodiment(s).

EMBODIMENT

Figure 1:
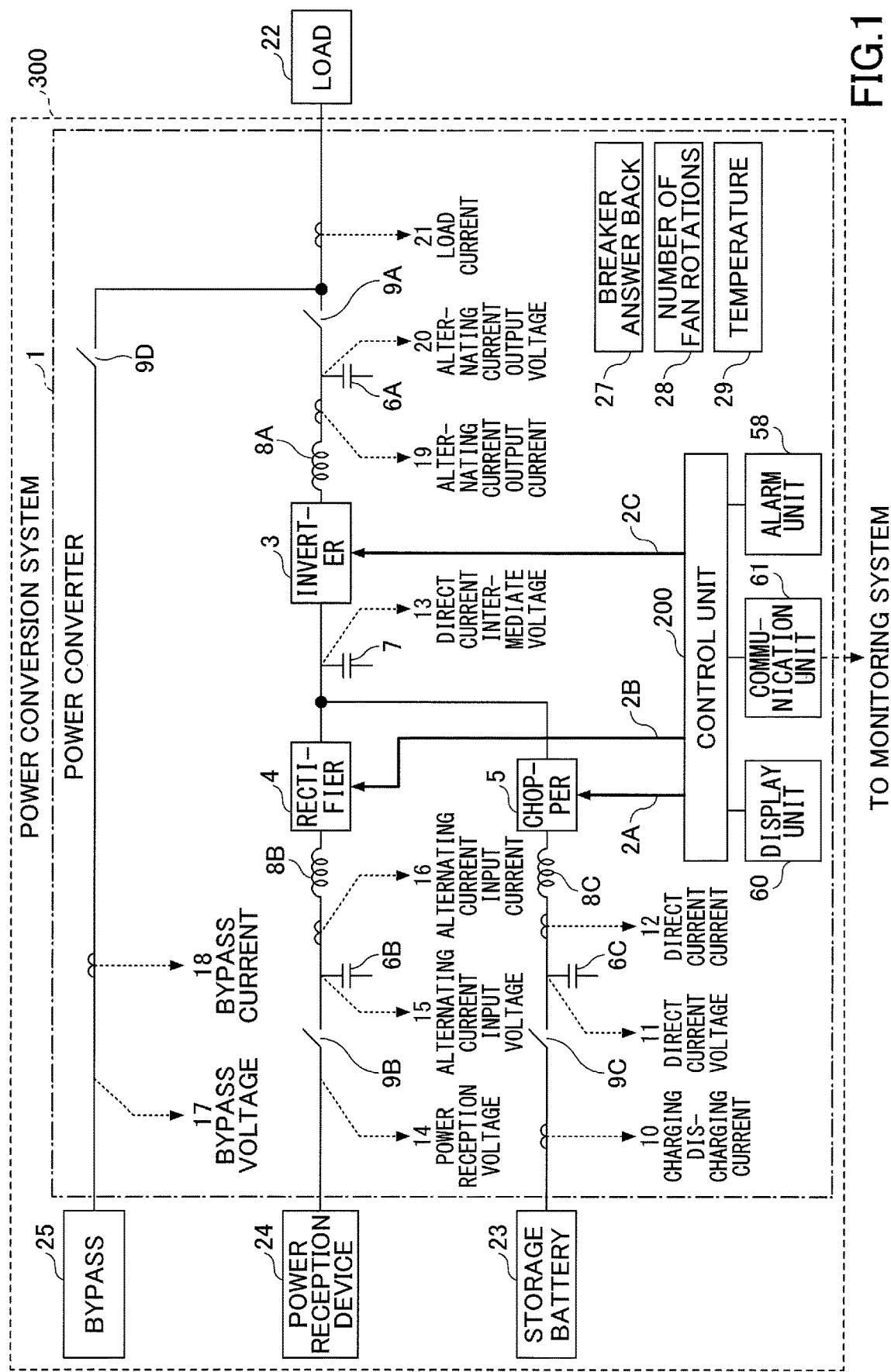
FIG. 1 is a drawing illustrating a configuration example of a power conversion system 300 including a power converter 1 according to an embodiment of the present invention.

FIG. 1 is a drawing illustrating an example configuration of a power conversion system 300 that includes a power converter 1 according to an embodiment of the present invention. The power conversion system 300 includes a power converter 1, a bypass 25, a power reception device 24 and a storage battery 23. In the case where an abnormality that does not lead to the failure of the power converter 1 occurs, or in the case where an abnormality caused by external environments of the power converter 1 occurs, the power conversion system 300 identifies the abnormality cause, indicates to a user abnormality indication information indicating that some abnormality has occurred by, for example, displaying the abnormality cause on a display unit 60 of the power converter 1, and indicates (transmits) the abnormality cause to a monitoring system via a communication unit 61 of the power converter 1. Further, the power conversion system 300 identifies the abnormality cause and indicates to the user that an abnormality has occurred via an alarm unit 58 of the power converter 1. Details of the display unit 60, the communication unit 61 and the alarm unit 58 will be described below. The power converter 1 may be an uninterruptible power supply (UPS), for example. In an embodiment of the present invention, a case is described in which the power converter 1 is an uninterruptible power supply (UPS). However, the power converter 1 is not limited to an uninterruptible power supply (UPS) and may be a solar power converter (power conditioner) that converts direct current power (DC power) from a solar panel to alternating current power (AC power); may be a converter that converts an input DC voltage to a different value of DC voltage, and outputs the converted voltage; or may be an inverter that converts an input DC voltage to an AC voltage, and outputs the converted voltage.

The power converter 1 includes a rectifier 4 for rectifying an alternating current (AC) voltage, a chopper 5, and an inverter 3 that converts a voltage output from the rectifier 4 or the chopper 5 to an alternating current (AC) voltage and outputs the converted voltage to a load 22. The rectifier 4, the chopper 5 and the inverter 3 constitute a power conversion unit.

Further, the power converter 1 includes a breaker 9A, a breaker 9B, a breaker 9C and a breaker 9D.

The input side of the rectifier 4 is connected to the power reception device 24 via the breaker 9B. The rectifier 4 is controlled by a control signal 2B that is output from a control unit 200. A capacitor 6B and a reactor 8B are connected between the rectifier 4 and the breaker 9B. The capacitor 6B and the reactor 8B constitute a harmonic filter.

The inverter 3 is connected to the output side of the rectifier 4. The inverter 3 is controlled by a control signal 2C that is output from the control unit 200. A capacitor 7 (direct current intermediate capacitor), which is used for smoothing an output voltage of the rectifier 4, is connected between the inverter 3 and the rectifier 4.

A load 22 is connected to the output side of the inverter 3 via the breaker 9A. A reactor 8A and a filter capacitor 6A are connected between the inverter 3 and the breaker 9A. The reactor 8A and the filter capacitor 6A constitute a harmonic filter.

The chopper 5 is connected between the output side of the rectifier 4 and the input side of the inverter 3. The chopper 5 is controlled by a control signal 2A that is output from the control unit 200. The storage battery 23 is connected to the chopper 5 via the breaker 9C.

A capacitor 6C and a reactor 8C are connected between the breaker 9C and the chopper 5. The capacitor 6C and the reactor 8C constitute a harmonic filter.

Each of the breaker 9A, the breaker 9B, the breaker 9C and the breaker 9D is opened or closed according to a turn-on command or a shut-off command output from the control unit 200. Wiring that is used for transmitting the turn-on command and the shut-off command output from the control unit 200 is omitted in FIG. 1.

The breaker 9A is an open/close unit used for connecting the load 22 to the inverter 3 or for releasing the connection between the inverter 3 and the load 22. The breaker 9B is an open/close unit used for connecting the rectifier 4 to the power reception device 24 or for releasing the connection between the power reception device 24 and the rectifier 4. The breaker 9C is an open/close unit used for connecting the chopper 5 to the storage battery 23 or for releasing the connection between the storage battery 23 and the chopper 5. The breaker 9D is an open/close unit used for connecting the load 22 to the bypass 25 or for releasing the connection between the bypass 25 and the load 22.

Abnormality cause identifying information for identifying an abnormality cause is input to the control unit 200. The abnormality cause identifying information includes a charging and discharging current 10, a direct current (DC) voltage 11, a direct current (DC) current 12, a direct current (DC) intermediate voltage 13, a power reception voltage 14, an alternating current (AC) input voltage 15, an alternating current (AC) input current 16, a bypass voltage 17, a bypass current 18, an alternating current (AC) output current 19, an alternating current (AC) output voltage 20, a load current 21, a breaker answer back 27, a number of fan rotations (fan speed) 28, and a temperature 29. Types of the abnormality cause identifying information are not limited to the above.

It is possible for the control unit 200 to identify whether an abnormality has occurred in the power converter 1 or the abnormality is caused by external environments of the power converter 1, and to identify an abnormality cause of an abnormality that does not lead to the failure of the power converter 1, by using the abnormality cause identifying information. An abnormality cause identifying method of the control unit 200 will be described below.

The abnormality cause of an abnormality that occurs in the power converter 1 may include, for example, a case in which a layer short of a capacitor has occurred, the junction temperature of a semiconductor chip becoming equal to or exceeding the rated temperature due to abnormal heating of the semiconductor element, etc.

The cause of an abnormality caused by the external environment of the power converter 1 may include, for example, a case in which a surge has occurred in the power reception device 24 due to a thunder, a case in which the alternating current (AC) power has significantly changed due to connection or disconnection of a large capacity load 22, a case in which an output of the power converter 1 has been limited because the rated capacity of an emergency power generation device (power reception device 24) is small, etc.

Other causes of an abnormality caused by the external environment of the power converter 1 may include, a case in which a ground fault (earth fault) has occurred between the power reception device 24 and the power converter 1, a case in which a ground fault (earth fault) has occurred between the load 22 and the power converter 1, etc.

The cause of an abnormality that does not lead to a failure of the power converter 1 may include, for example, a case in which noise is overlapped with a voltage or a current due to the inductance decrease due to the layer short of the reactor, etc.

The charging and discharging current 10 is the current detected by a current detector that detects the current flowing between the storage battery 23 and the breaker 9C. The direct current (DC) voltage 11 is the voltage detected by a voltage detector that detects the value of the voltage applied to the capacitor 6C.

The direct current (DC) current 12 is the current detected by a current detector that detects the value of the current flowing between the breaker 9C and the chopper 5. The direct current (DC) intermediate voltage 13 is the voltage detected by a voltage detector that detects the value of the voltage applied to the capacitor 7.

The power reception voltage 14 is the voltage detected by a voltage detector that detects the value of the voltage output from the power reception device 24. The alternating current (AC) input voltage 15 is the voltage detected by a voltage detector that detects the value of the voltage applied to the input side of the rectifier 4. The alternating current (AC) input current 16 is the current detected by a current detector that detects the value of the current that is input to the rectifier 4.

The bypass voltage 17 is the voltage detected by a voltage detector that detects the value of the voltage output from the bypass 25. The bypass current 18 is the current detected by a current detector that detects the value of the current flowing into the load 22 from the bypass 25.

The alternating current (AC) output current 19 is the current detected by a current detector that detects the value of the alternating current (AC) current that is output from the inverter 3. The alternating current (AC) output voltage 20 is the voltage detected by a voltage detector that detects the value of the alternating current (AC) voltage that is output from the inverter 3. The load current 21 is the current detected by a current detector that detects the value of the current flowing into the load 22.

The breaker answer back 27 is information indicating an open/closed state of each of the breaker 9A, the breaker 9B, the breaker 9C and the breaker 9D. The breaker answer back 27 is output from an auxiliary switch 44, which will be described below. The auxiliary switch 44 is a normally-open switch or a normally-closed switch that is provided at each of the breaker 9A, the breaker 9B, the breaker 9C and the breaker 9D. The number of fan rotations 28 is information indicating the number of fan rotations detected by a number-of-fan-rotations sensor (fan speed sensor) that will be described below. The temperature 29 is information indicating a value of temperature detected by a temperature sensor that will be described below.

Figure 2:
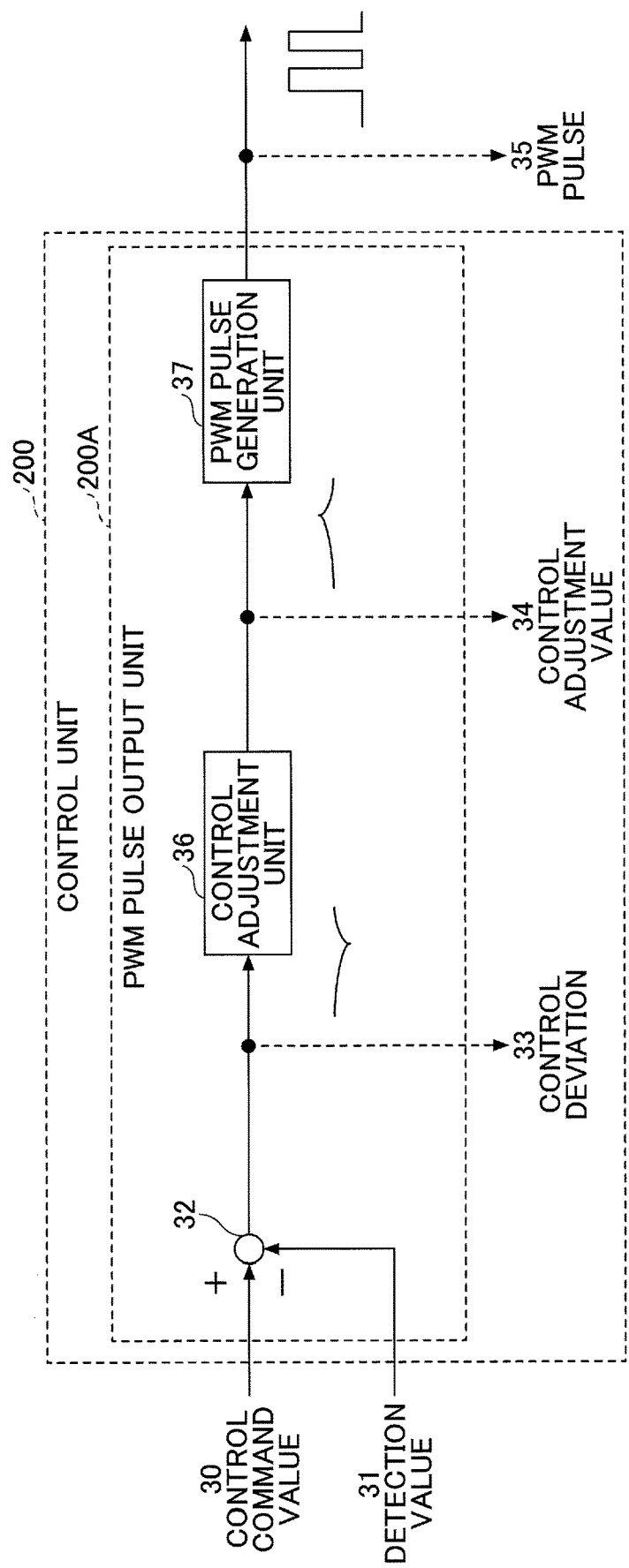
FIG. 2 is a drawing illustrating a function of generating a PWM pulse 35.

FIG. 2 is a drawing illustrating a function of generating a PWM pulse 35. FIG. 2 illustrates a configuration example of a PWM pulse output unit 200A including a function, among multiple functions included in the control unit 200, for generating and outputting a PWM pulse 35 as the control signal 2A, the control signal 2B or the control signal 2C.

The PWM pulse output unit 200A includes a subtraction unit 32, a control adjustment unit 36, and a PWM pulse generation unit 37.

The subtraction unit 32 outputs a control deviation 33 that is a difference between a detection value 31 and a control command value 30. The detection value 31 includes the charging and discharging current 10, the direct current (DC) voltage 11, the direct current (DC) current 12, the direct current (DC) intermediate voltage 13, the power reception voltage 14, the alternating current (AC) input voltage 15, the alternating current (AC) input current 16, the bypass voltage 17, the bypass current 18, the alternating current (AC) output current 19, the alternating current (AC) output voltage 20, the load current 21, etc. The control command value 30 is a target value of an output of the power converter 1.

The control adjustment unit 36 generates a control adjustment value 34 (information specifying a duty factor (energization rate)) that depends on the control deviation 33 output from the subtraction unit 32. The PWM pulse generation unit 37 generates the PWM pulse 35 based on the control adjustment value 34.

Figure 3:
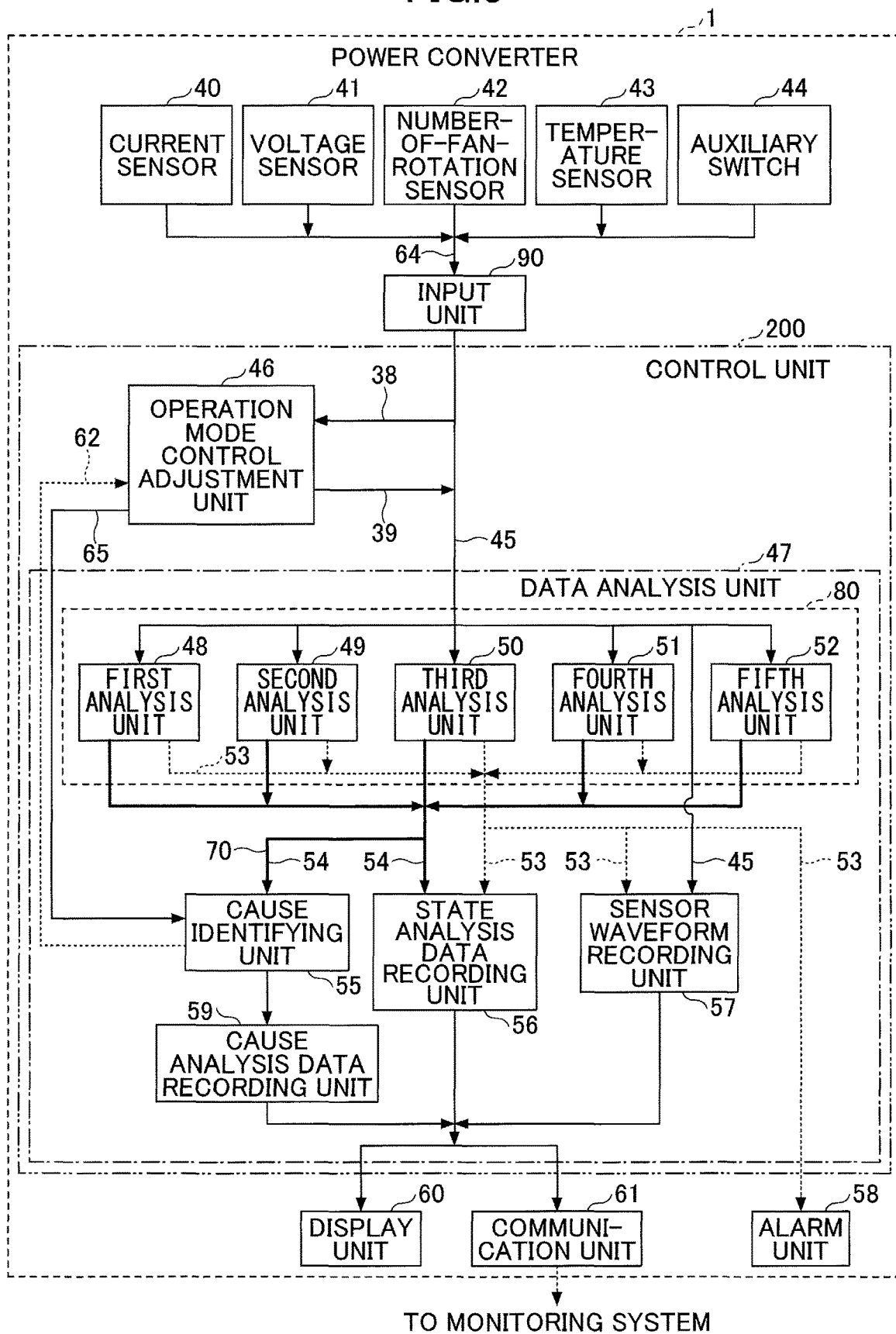
FIG. 3 is a drawing illustrating a function of performing a data analysis included in the power converter 1.

FIG. 3 is a drawing illustrating a function of performing a data analysis included in the power converter 1. The power converter 1 includes an input unit 90 to which a sensor detection value 64 (detection value) is input. The control unit 200 includes an operation mode control adjustment unit 46 and a data analysis unit 47.

In the input unit 90, the sensor detection value 64 is converted to data that can be handled by the data analysis unit 47. Specifically, the input unit 90 performs analog-todigital conversion of the sensor detection value 64, and outputs the converted data. The converted data is input to the operation mode control adjustment unit 46 as sensor detection data 38. The operation mode control adjustment unit 46 performs operation mode control adjustment of the power converter 1 based on the sensor detection data 38. Control adjustment data 39, which is output from the operation mode control adjustment unit 46, is input to the data analysis unit 47. It should be noted that the control deviation 33 and the control adjustment data 39 are digitized values that are respectively obtained by performing analog-to-digital conversion of the control deviation 33 and the control adjustment value 34 illustrated in FIG. 2.

The alarm unit 58, the display unit 60 and the communication unit 61 are connected to the control unit 200. The alarm unit 58 and the display unit 60 may be provided in the body of the power converter 1, or may be provided at a location remote from the power converter 1 via a communication line. The communication unit 61 is able to transmit and receive information to and from the monitoring system via a communication line.

The operation mode control adjustment unit 46 generates operation mode information 65 (mode parameter) based on the sensor detection data 38 and outputs the generated information. Analysis data 62 is information indicating the analysis result of a cause identifying unit 55. The operation mode control adjustment unit 46 stops the operation of the power converter 1, and more specifically, determines control for the rectifier 4, the inverter 3 and the chopper 5 based on the received analysis data 62. The operation mode information 65 is input to the cause identifying unit 55. The mode parameter is a parameter that is changed according to an operation state and a control state of the power converter 1, and a cause determination target.

The sensor detection value 64 is detection information that is detected by any of a current sensor 40, a voltage sensor 41, a number-of-fan-rotations sensor 42 and a temperature sensor 43.

The current sensor 40 is a sensor that detects the charging and discharging current 10, the direct current (DC) current 12, the alternating current (AC) input current 16, the bypass current 18, the alternating current (AC) output current 19, the load current 21, etc.

The voltage sensor 41 is a sensor that detects the direct current (DC) voltage 11, the direct current (DC) intermediate voltage 13, the power reception voltage 14, the alternating current (AC) input voltage 15, the bypass voltage 17, the alternating current (AC) output voltage 20, etc.

The number-of-fan-rotations sensor 42 is a sensor that detects the number of rotations (the number of fan rotations 28) of a cooling fan that is provided inside the power converter 1. The temperature sensor 43 may be: sensors that detect temperatures of parts provided inside the power converter 1; sensors that detect ambient temperatures of the parts; a sensor that detects environmental temperature of the power converter 1; sensors that detect temperatures of semiconductor elements included in each of the rectifier 4, the inverter 3 and the chopper 5.

The operation mode information 65 is information indicating contents of operation modes. The operation modes include, for example, a charging operation mode, an alternating current (AC) operation mode, an input limited operation mode, a direct current (DC) operation mode, etc.

The charging operation mode is an operation mode for storing power/energy in the storage battery 23 by performing voltage-decreasing operations of the chopper 5 when power supply from the power reception device 24 is not stopped.

The alternating current (AC) operation mode is a normal operation mode (non-power-failure mode) for driving the load 22 by using power supplied from the power reception device 24.

The input limited operation mode is an operation mode in which the power input from the power reception device 24 is limited (insufficient) and power deficit is supplied from the storage battery 23 via the chopper 5 by discharging the storage battery 23 in a case of overloaded state in which the load 22 is greater than the power capacity of the power reception device 24, The direct current (DC) operation mode is an operation mode used during a power failure for supplying the power stored in the storage battery 23 to the load by performing voltage-increasing operations of the chopper 5 when power supply from the power reception device 24 is stopped.

It should be noted that the operation mode control adjustment unit 46 may generate information described below as the operation mode information 65 and may input the generated information to the cause identifying unit 55.

For example, the operation mode control adjustment unit 46 may generate, as an output, information indicating that a direct current (DC) short circuit has occurred, information indicating that an abnormality has occurred in the storage battery 23 (information indicating that the temperature generated by the storage battery 23 is higher than a set value, information indicating that the storage battery 23 is in a over voltage state or in an insufficient charging state, or the like), information indicating that an abnormality has occurred in the inverter 3 (information indicating that an output voltage of the inverter 3 is lower than a set value, or the like), or the like.

Further, the operation mode control adjustment unit 46 may generate an over current information indicating that the current provided by the power reception device 24 is higher than a set value and output the generated information, or the operation mode control adjustment unit 46 may generate switch timing information indicating a timing switching from the power reception device 24 to the bypass 25 and output the generated information. It should be noted that, when switching from the power reception device 24 to the bypass 25, the control unit 200 controls the alternating current (AC) output voltage of the inverter 3 to synchronize with the voltage, phase, etc., of the bypass 25 before the switching. Therefore, when an abnormality occurs in the inverter 3 and an output voltage is insufficient, a phenomenon occurs in which power from the bypass 25 flows into the inverter 3 at the time of bypass switching.

The data analysis unit 47 includes an abnormality determination unit 80, a cause identifying unit 55, a state analysis data recording unit 56, a sensor waveform recording unit 57, and a cause analysis data recording unit 59.

The abnormality determination unit 80 includes a first analysis unit 48 for performing the first analysis, a second analysis unit 49 for performing the second analysis, a third analysis unit 50 for performing the third analysis, a fourth analysis unit 51 for performing the fourth analysis, and a fifth analysis unit 52 for performing the fifth analysis. Hereinafter, for the sake of description convenience, "the first analysis unit 48, the second analysis unit 49, the third analysis unit 50, the fourth analysis unit 51 and the fifth analysis unit 52" may be collectively referred to as "the first analysis unit 48".

Sensor detection data 38, control deviation and control adjustment data 38 are input to the first analysis unit 48, etc.

Figure 4:
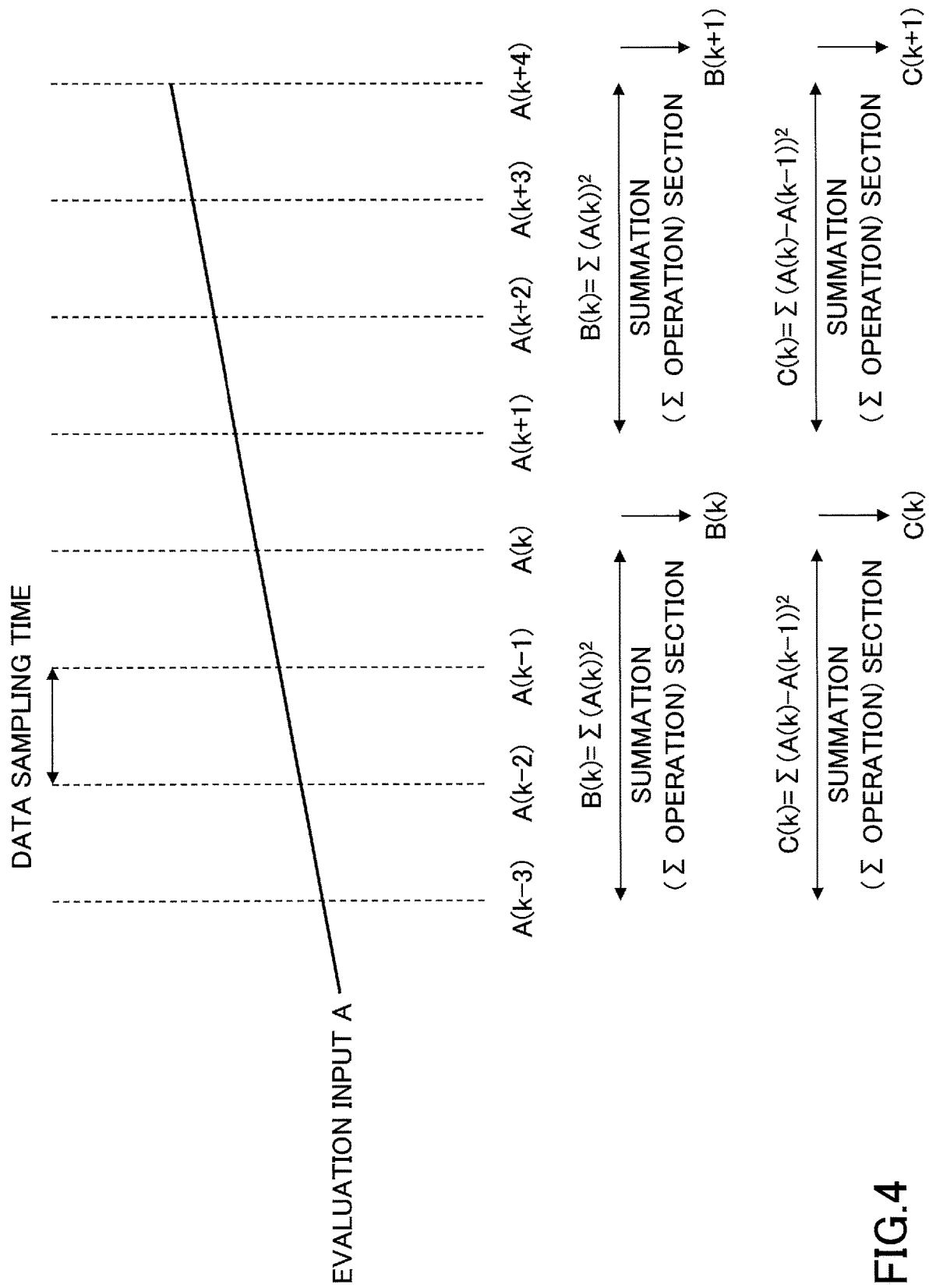
FIG. 4 is a drawing illustrating data-sampling processing performed by a first analysis unit 48 illustrated in FIG. 3, and arithmetic processing using sampled discrete data items.

FIG. 4 is a drawing illustrating data-sampling processing performed by the first analysis unit 48 illustrated in FIG. 3, and arithmetic processing using sampled discrete data items.

An evaluation input illustrated in FIG. 4 includes the above-described charging and discharging current 10, the direct current (DC) voltage 11, the direct current (DC) current 12, the direct current (DC) intermediate voltage 13, the power reception voltage 14, the alternating current (AC) input voltage 15, the alternating current (AC) input current 16, the bypass voltage 17, the bypass current 18, the alternating current (AC) output current 19, the alternating current (AC) output voltage 20, the load current 21, the breaker answer back 27, the number of fan rotations 28, temperature 29, etc.

Sampling of the evaluation input A is performed at every data sampling time and the evaluation input A is converted into discrete data items (sampling values). In FIG. 4, the sampling values are denoted as A(k−3), A(k−2), A(k), etc.

The first analysis unit 48, or the like, calculates a summation value B by calculating square of each of the sampling values and calculating the summation of squared results included in a certain time period (square summation operation). The summation value B(k) is summation of squared sampling values from A(k−3) to A(k). The summation value B(k+1) is summation of squared sampling values from A(k+1) to A(k+4).

Further, the first analysis unit 48, or the like, calculates a summation value C by calculating square of each of differences between consecutive sample values (square of each sample data difference) and calculating the summation of squared results with respect to a certain time period. A summation value C(k) is the summation of squared sample data differences from A(k−3) to A(k). A summation value C(k+1) is the summation of squared sample data differences from A(k+1) to A(k+4).

[First Analysis Unit 48]

Figure 5:
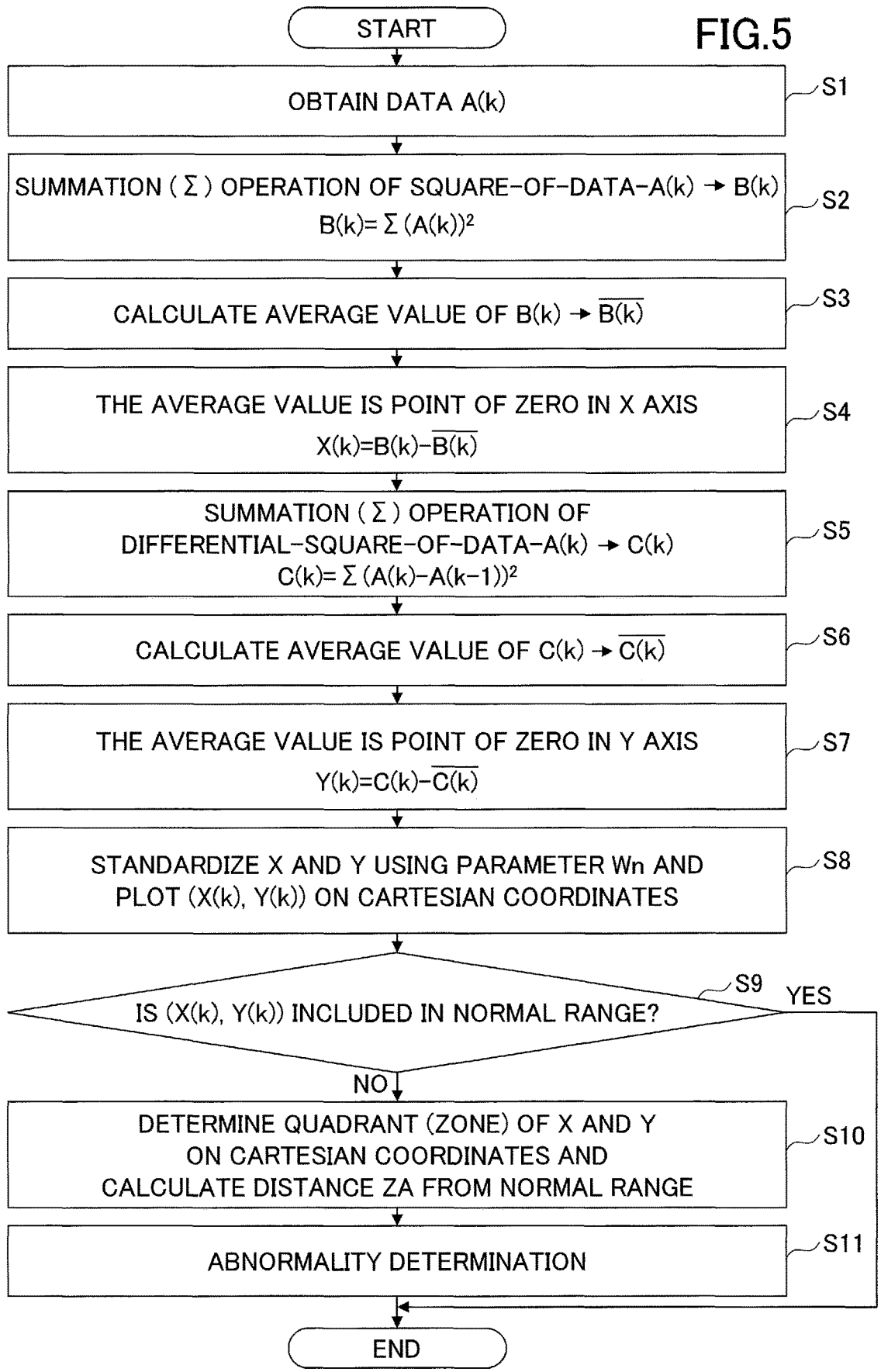
FIG. 5 is a flowchart illustrating operations of the first analysis unit 48.
Figure 6:
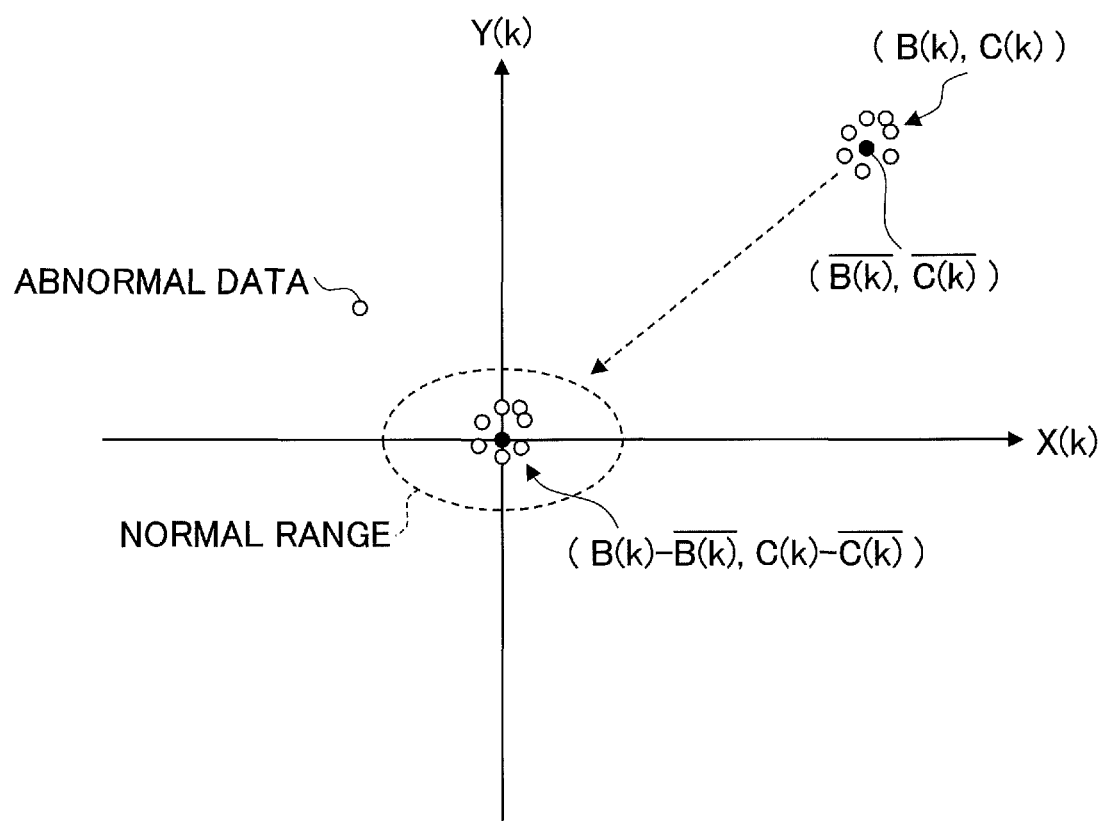
FIG. 6 is a drawing illustrating an average value of a summation value B(k), an average value of a summation value C(k), and a normal range that are plotted on Cartesian coordinates.

Next, operations of the first analysis unit 48 will be described. FIG. 5 is a flowchart illustrating operations of the first analysis unit 48. FIG. 6 is a drawing illustrating an average value of the summation value B(k), an average value of the summation value C(k), and a normal range that are plotted on Cartesian coordinates. The normal range is a determination area preset according to a predetermined condition.

In step S1, the first analysis unit 48 obtains sample values of the evaluation input A (data A(k)).

In step S2, the first analysis unit 48 calculates a summation value B(k) by calculating summation of squared data items A(k).

In step S3, the first analysis unit 48 calculates an average value of the summation value B(k) calculated in step S2.

In step S4, the first analysis unit 48 performs processing of plotting in the vicinity of the origin of Cartesian coordinates by subtracting the average value of the summation value B(k) calculated in step S3 from the summation value B(k) calculated in step S2. The average value of the summation value B(k) that is plotted in the Cartesian coordinates is illustrated in FIG. 6.

In step S5, the first analysis unit 48 calculates a summation value C(k) by calculating summation of squared data items.

In step S6, the first analysis unit 48 calculates an average value of the summation value C(k) calculated in step S5.

In step S7, the first analysis unit 48 performs processing of plotting in the vicinity of the origin of Cartesian coordinates by subtracting the average value of the summation value C(k) calculated in step S6 from the summation value C(k) calculated in step S5. The average value of the summation value Ck) that is plotted in the Cartesian coordinates is illustrated in FIG. 6.

In step S8, the first analysis unit 48 converts B(k) and C(k) into a value that can be plotted in the Cartesian coordinates by multiplying each of B(k) calculated in step S2 and C(k) calculated in step S5 with a parameter (standardization/normalization parameter) Wn. "n" in Wn is a natural number equal to or greater than one (1) and indicates an analysis number (the number of analyses).

In step S9, the first analysis unit 48 determines whether the data plotted in step S8 (target data) is within the normal range illustrated in FIG. 6 or is outside the normal range. The normal range is calculated taking into account an operation state of the power converter 1, a manufacturing abnormality of the power converter 1, a detection abnormality of each of the sensors, etc., and is preset in the first analysis unit 48.

For example, in the case where levels of the bypass voltage, the power reception voltage, the charging and discharging current are increased or decreased from specified values, if the levels of the bypass voltage, the power reception voltage, the charging and discharging current are changed in a short period (changed suddenly), then the data plotted in step S8 is located outside the normal range. Abnormality data illustrated in FIG. 6 is the data plotted in step S8.

The first analysis unit 48 stops processing in the case where it is determined that the data is within the normal range (step S9, Yes). The first analysis unit 48 performs processing of step S10 in the case where it is determined that the data is outside the normal range (step S9, No).

In step S10, the first analysis unit 48 determines the quadrant of Cartesian coordinates in which the data outside of the normal range is present, specifically, whether the data outside of the normal range is present in the first quadrant, the second quadrant, the third quadrant, or the fourth quadrant. Further, in step S10, the first analysis unit 48 calculates a distance ZA from the data, which is determined to be outside the normal range, to the normal range (distance from the normal range). In other words, the first analysis unit 48 calculates how far the plotted data is away from the normal range. Calculated distance information 70 is input to the cause identifying unit 55. The cause identifying unit 55 identifies an abnormality cause based on the quadrant in which the data, which is determined to be outside the normal range, is present. Details of the cause identifying unit 55 will be described below.

Figure 7:
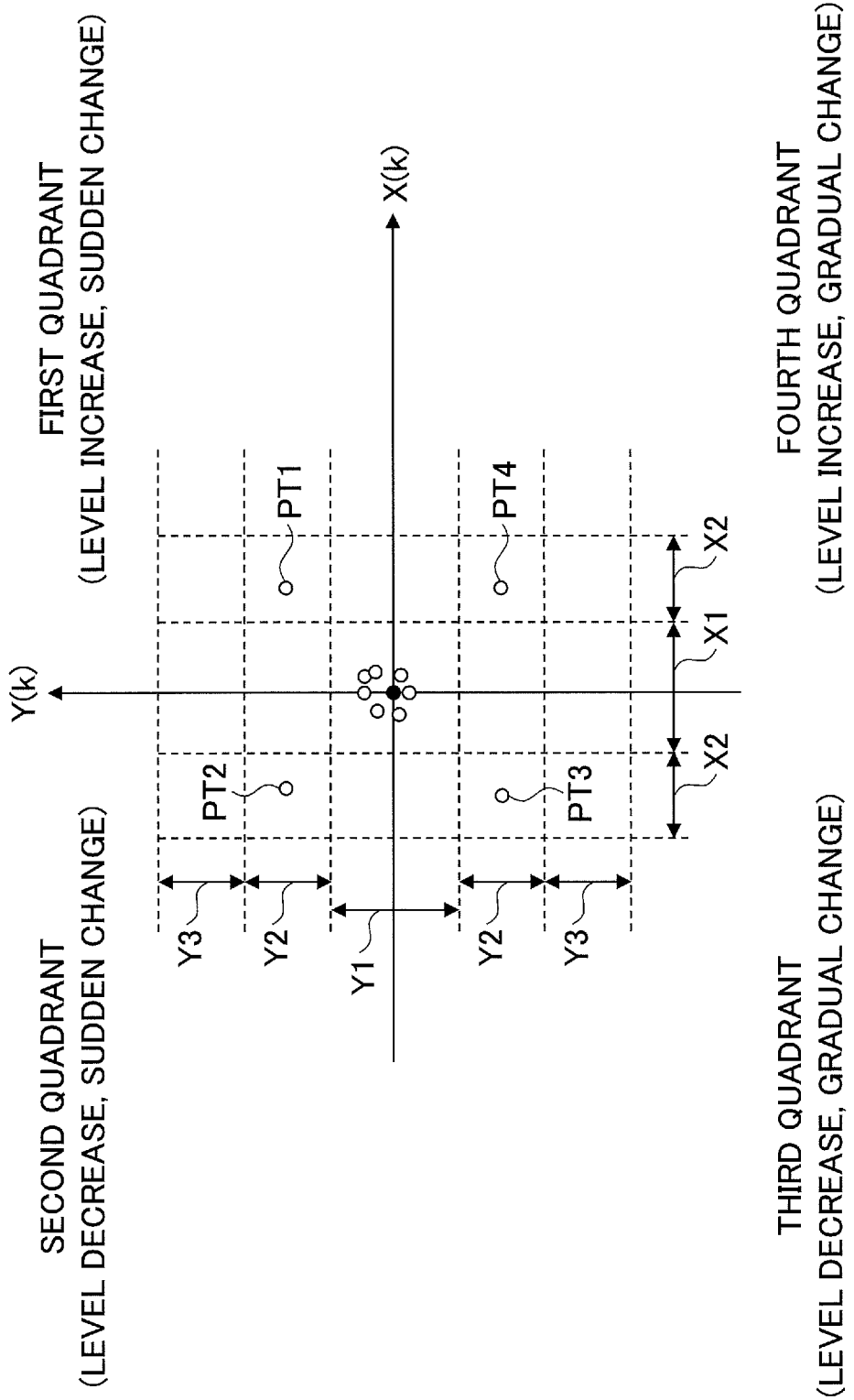
FIG. 7 is a drawing illustrating operations in step S10.

Operations of step S10 will be described by referring to FIG. 7. FIG. 7 is a drawing illustrating operations in step S10.

In the Cartesian coordinates illustrated in FIG. 7, the X-axis direction indicates whether the level of the bypass voltage, the power reception voltage, the alternating current (AC) output current, the alternating (AC) output voltage, the charging and discharging current, or the like, is increasing or decreasing. A positive X-axis direction indicates that the level is increasing, and a negative X-axis direction indicates that the level is decreasing.

A Y-axis direction indicates a change degree (the rate of change) of the level of the bypass voltage, the power reception voltage, the alternating current (AC) output current, the alternating (AC) output voltage, the charging and discharging current, or the like. A positive Y-axis direction indicates a sudden level change, and a negative Y-axis direction indicates a gradual level change.

The first quadrant is an area indicating that the detected data level has increased and has changed suddenly. The second quadrant is an area indicating that the detected data level has decreased and has changed suddenly. The third quadrant is an area indicating that the detected data level has decreased and has changed gradually. The fourth quadrant is an area indicating that the detected data level has increased and has changed gradually.

Each of Y1, Y2, Y3, X1, X2, and X3 illustrated in FIG. 7 is a determination area used for determining an abnormality level by using, as a reference, a distance from the data, which has been plotted at the time of abnormality occurrence, to the normal range.

The determination areas Y1, Y2, and Y3 are used for determining whether the level of the bypass voltage, the power reception voltage, the alternating current (AC) output current, the alternating (AC) output voltage, the charging and discharging current, or the like, has changed suddenly in a short period of time or has changed gradually. The change rate of the level of the voltage, current, or the like, increases as the suffix number increases in the order of Y1, Y2, and Y3. In other words, the greater the data plotted at the time of abnormality occurrence deviates from the normal range, the greater is the change rate of the level of the voltage, current, or the like. The determination areas Y1, Y2, and Y3 are preset in the first analysis unit 48.

The determination areas X1, X2, and X3 are used for determining how much the level of the bypass voltage, the power reception voltage, the alternating current (AC) output current, the alternating (AC) output voltage, the charging and discharging current, or the like, has increased or has decreased. The increasing amount or the decreasing amount of the level of the voltage, current, or the like, increases as the suffix number increases in the order of X1, X2, and X3. In other words, the more the data plotted at the time of abnormality occurrence is away from the normal range, the greater is the increasing amount or the decreasing amount of the level of the voltage, current, or the like. X1, X2, and X3 are preset in the first analysis unit 48.

The data plotted in the area where X2 overlaps with Y2 in the first quadrant is illustrated as PT1 in FIG. 7. The data plotted in the area where X2 overlaps with Y2 in the second quadrant is illustrated as PT2 in FIG. 7. The data plotted in the area where X2 overlaps with Y2 in the third quadrant is illustrated as PT3 in FIG. 7. The data plotted in the area where X2 overlaps with Y2 in the fourth quadrant is illustrated as PT4 in FIG. 7. The data items PT1 through PT4 are derived from currents, voltages, or the like, detected at the time of abnormality occurrence. The above-described summation operations are applied to the currents, voltages, or the like, detected at the time of abnormality occurrence, and the applied results are plotted on Cartesian coordinates as the data items PT1 through PT4.

In this way, it is possible to indicate to a user whether the level of the current, voltage, or the like, detected at the time of abnormality occurrence is increasing or decreasing, by plotting the data on Cartesian coordinates. Furthermore, it is possible to indicate to a user whether the level of the current, voltage, or the like, detected at the time of abnormality occurrence has changed suddenly or has changed gradually. For example, when plotting data based on the power reception voltage, in the case where the balance on the power reception side is broken and the power reception voltage has gradually increased/decreased, the level of the voltage increases/decreases but the level does not change suddenly. Therefore, in this case, the data will be plotted on the positive side/negative side near the X-axis and away from the normal state range. Further, in the case where the power reception device 24 is a solar power generation device, and where the power reception voltage changes suddenly or changes gradually due to the sudden change or the gradual change of solar radiation, the breaker is opened/closed, or a lightning surge has occurred due to the lightning strike, a ripple may occur in the power reception voltage. In these cases, the level of the voltage may not change but the sudden change of the level may occur, and thus, the data will be plotted on the positive side/negative side near the Y-axis and away from the normal state range. It is possible for a user to estimate an abnormality state by understanding whether the level is in an increasing state or in a decreasing state, or whether the level has changed suddenly or has changed gradually.

Furthermore, it is possible to indicate to a user how far the detected data deviates from the normal range by combining determination areas of X1, X2, X3, Y1, Y2, Y3 on Cartesian coordinates. Specific examples of abnormality determination operations of the first analysis 48 will be described referring to FIG. 8.

Figure 8:
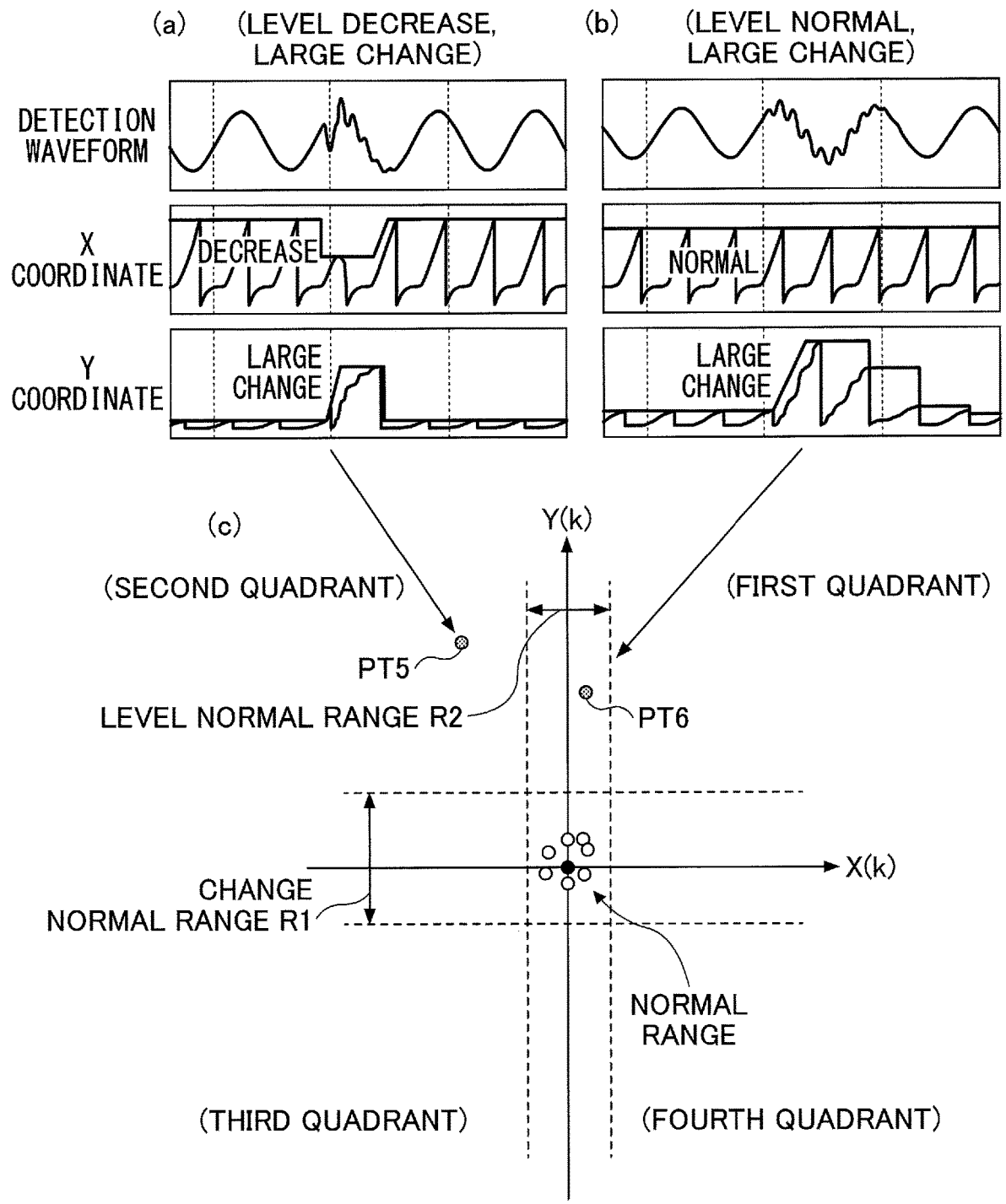
FIG. 8 is a drawing illustrating a specific example of operations of the first analysis unit 48.

FIG. 8 is a drawing illustrating a specific example of operations of the first analysis unit 48.

FIG. 8(a) illustrates an example of a case in which the level of an alternating current (AC) voltage decreases instantaneously (suddenly) and the change rate of the AC voltage is large (sudden change) FIG. 8(b) illustrates an example of a case in which the level of an alternating current (AC) voltage is normal and the change rate of the AC voltage is large.

Each of FIG. 8(a) and FIG. 8(b) illustrates, for example, a waveform of the alternating current (AC) voltage (detection waveform, detected waveform), a value of X-axis of Cartesian coordinates, and a value of Y-axis of Cartesian coordinates. It should be noted that the value of X-axis indicates a result of dividing the period/cycle of the detection waveform and performing summation operations within the period/cycle. In an embodiment of the present invention, one period/cycle is divided by six (6). Preferably, it is possible to determine the change of the detection waveform in a more detailed and speedy manner by performing parallel processing in which, when analyzing one period/cycle, with respect to the start timing of the operation cycle, the operation cycles start at respective start timings. The same consideration applies to the value of Y-axis. Values connecting the transition of maximum values of calculation results are plotted as values in X-axis and Y-axis.

In the detection waveform illustrated in FIG. 8(a), the voltage level is decreased in a half period of the alternating current. As a result of operations of summation value B(k), the value in X-axis in FIG. 8(a) indicates an inclination/tendency of decreasing temporarily. Further, as a result of operations of summation value Y(k), the value in Y-axis in FIG. 8(a) indicates an inclination/tendency of increasing temporarily.

The first analysis unit 48 plots PT5 on Cartesian coordinates in FIG. 8(c) by performing the first analysis with respect to the above-described waveform.

In the detection waveform illustrated in FIG. 8(b), there are fluctuations in the effective value (root mean square value) of the alternating current (AC) voltage. However, the level is normal. As a result of operations of summation value B(k), the value in X-axis in FIG. 8(b) does not change. However, the value in Y-axis in FIG. 8(b) indicates an inclination/tendency of increasing temporarily.

The first analysis unit 48 plots PT6 on Cartesian coordinates in FIG. 8(c) by performing the first analysis with respect to the above-described waveform.

In Cartesian coordinates illustrated in FIG. 8(c), a change normal range R1 (a range indicating that the change is normal) and a level normal range (a range indicating that the level is normal) are set. The change normal range R1 corresponds to the determination area Y1 illustrated in FIG. 7. The level normal range R2 corresponds to the determination area X1 illustrated in FIG. 7. The change normal range R1 and the level normal range R2 are preset. Dotted lines indicating an upper limit and a lower limit of each of the change normal range R1 and the level normal range R2 in the present description are illustrated as straight lines. However, they are not limited to the straight lines but may be curved lines.

In FIG. 8(c), in the second quadrant, the plot PT5 is located outside of the change normal range R1 and outside of the level normal range R2. Further, in the first quadrant, the plot PT6 is located outside of the change normal range R1 and located inside of the level normal range R2. According to the above plotting, in FIG. 8(a), it is understood that the level of the alternating current (AC) voltage is decreased and the level is changed suddenly. Further, in FIG. 8(b), it is understood that the level of the alternating current (AC) voltage is not changed and only the sudden change of the level has occurred. As described above, it becomes possible to analyze the disorder of the waveform that cannot be identified by simply comparing detected waveforms, and it becomes possible to estimate an abnormality state. Specifically, it becomes possible to determine whether the abnormality has occurred in the power converter 1 or the abnormality has occurred on either of the power reception side or the load side.

The plot PT5 is located outside of the change normal range R1 and outside of the level normal range R2. Therefore, in step S11, the first analysis unit 48 determines that an abnormality has occurred, and outputs, as an abnormality determination information 53 (refer to FIG. 3), the result of determining that an abnormality has occurred. The abnormality determination information 53 is input to each of the state analysis data recording unit 56, the sensor waveform recording unit 57, and the alarm unit 58.

An abnormality level value 54 and the abnormality determination information 53 indicating the result of determining that an abnormality has occurred are recorded in the state analysis data recording unit 56. It should be noted that the abnormality level value 54 and the abnormality determination information 53 may be recorded with corresponding abnormality occurrence date and time. Information recorded in the state analysis data recording unit 56 may be input to, for example, the display unit 60 and the communication unit 61. Details of the display unit 60 and the communication unit 61 will be described below.

For example, the abnormality determination information 53 and evaluation input data 45 (corresponding to the evaluation input A illustrated in FIG. 4) are recorded in the sensor waveform recording unit 57. The abnormality determination information 53 and the evaluation input data 45 may be recorded with date and time when current values are detected by sensors (e.g., current sensor 40) and with abnormality occurrence date and time. Information recorded in the sensor waveform recording unit 57 is input to, for example, the display unit 60 and the communication unit 61. It should be noted that the evaluation input data is generated by applying analog-to-digital conversion to the sensor detection value 64, the control deviation 33, and the control adjustment value 34.

Further, the first analysis unit 48 calculates how far the plotted data is away from the normal range, and inputs the distance information 70 as a calculation result to the cause identifying unit 55. A calculation method of the distance information 70 will be described below.

The first analysis unit 48 generates a value (abnormality level value 54) indicating which determination area (the above-described X1, etc.) the plotted data is located in, and inputs the generated value to the cause identifying unit 55, the state analysis data recording unit 56, etc.

In the method of generating the abnormality level value 54, for example, table information, in which the determination area such as X1 is associated with a generated value (abnormality level value 54), may be stored in a memory, and the first analysis unit 48 may read out a value corresponding to the plotted data by referring to the table information, and may output the corresponding value as the abnormality level value 54.

As an example of the method for generating the abnormality level value 54, table information corresponding to the abnormal level is created by each of the first quadrant to the fourth quadrant to be stored in a memory by using the area where X1 and Y1 overlap as the normal range, and other areas, such as the area where X1 and Y2 overlap, the area where X2 and Y2 overlap, and the area where X2 and Y3 overlap, etc., and the table information corresponding to the abnormal level is stored in the memory. The first analysis unit 48 reads out the corresponding numerical value by comparing the plotted data with the table for each quadrant and outputs the abnormal level value 54.

[Second Analysis Unit 49]

Next, operations of the second analysis unit 49 will be described. For example, in the case where a load, which has been stopped (OFF), is started (turned ON), the direct current (DC) voltage of the rectifier 4 temporarily decreases from a rectification constant value. Further, in the case where a load 22 with large capacity, which has been operating normally, is turned OFF (power supply is released), the direct current (DC) voltage of the rectifier 4 temporarily increases from a rectification constant value. The control command value may change due to noise effects. The second analysis unit 49 generates information used for abnormality cause identification by the cause identifying unit 55 by plotting the above-described change in Cartesian coordinates. It is possible to analyze disorders that occur in external environments of the power converter 1.

Figure 9:
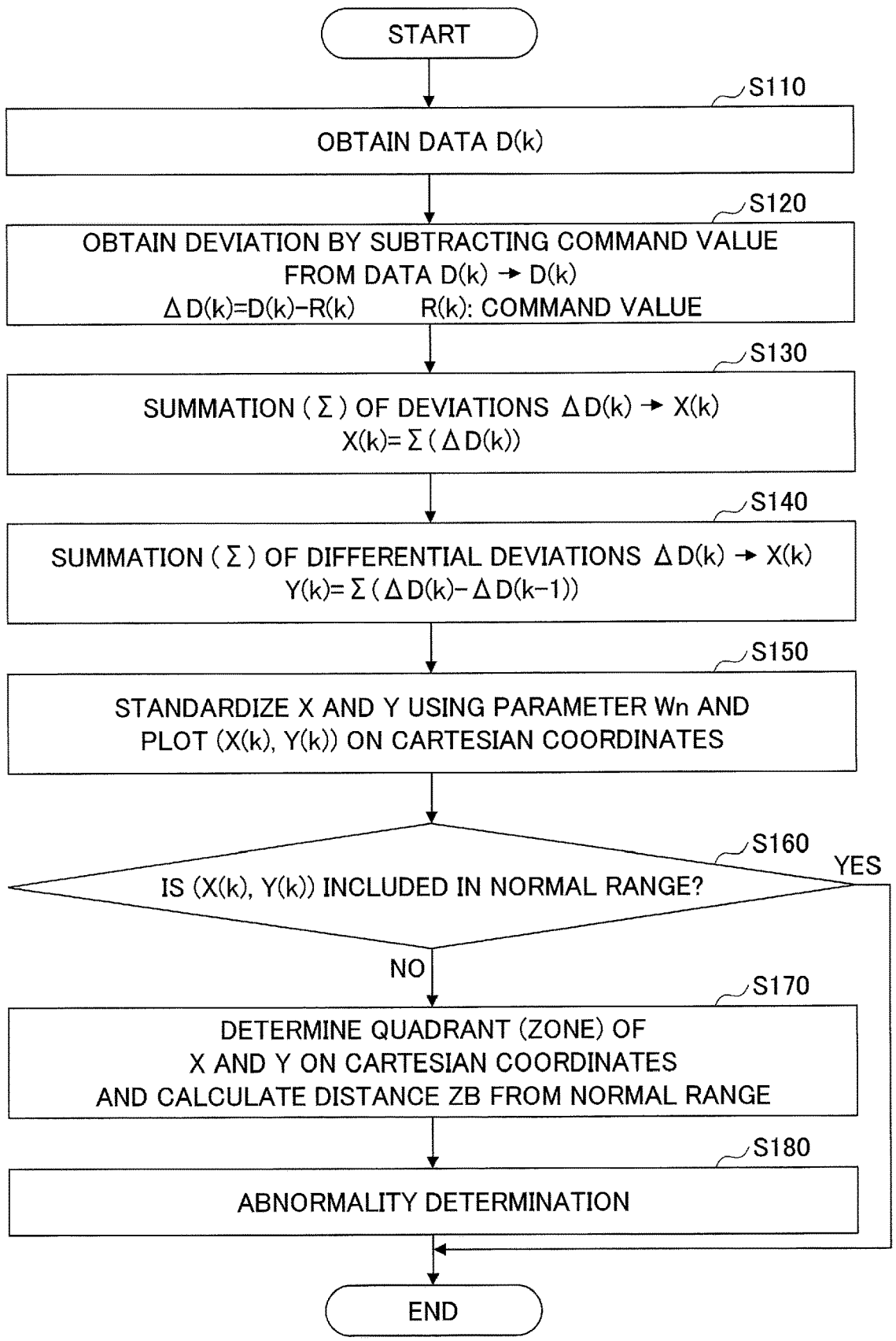
FIG. 9 is a flowchart illustrating operations of a second analysis unit 49.
Figure 10:
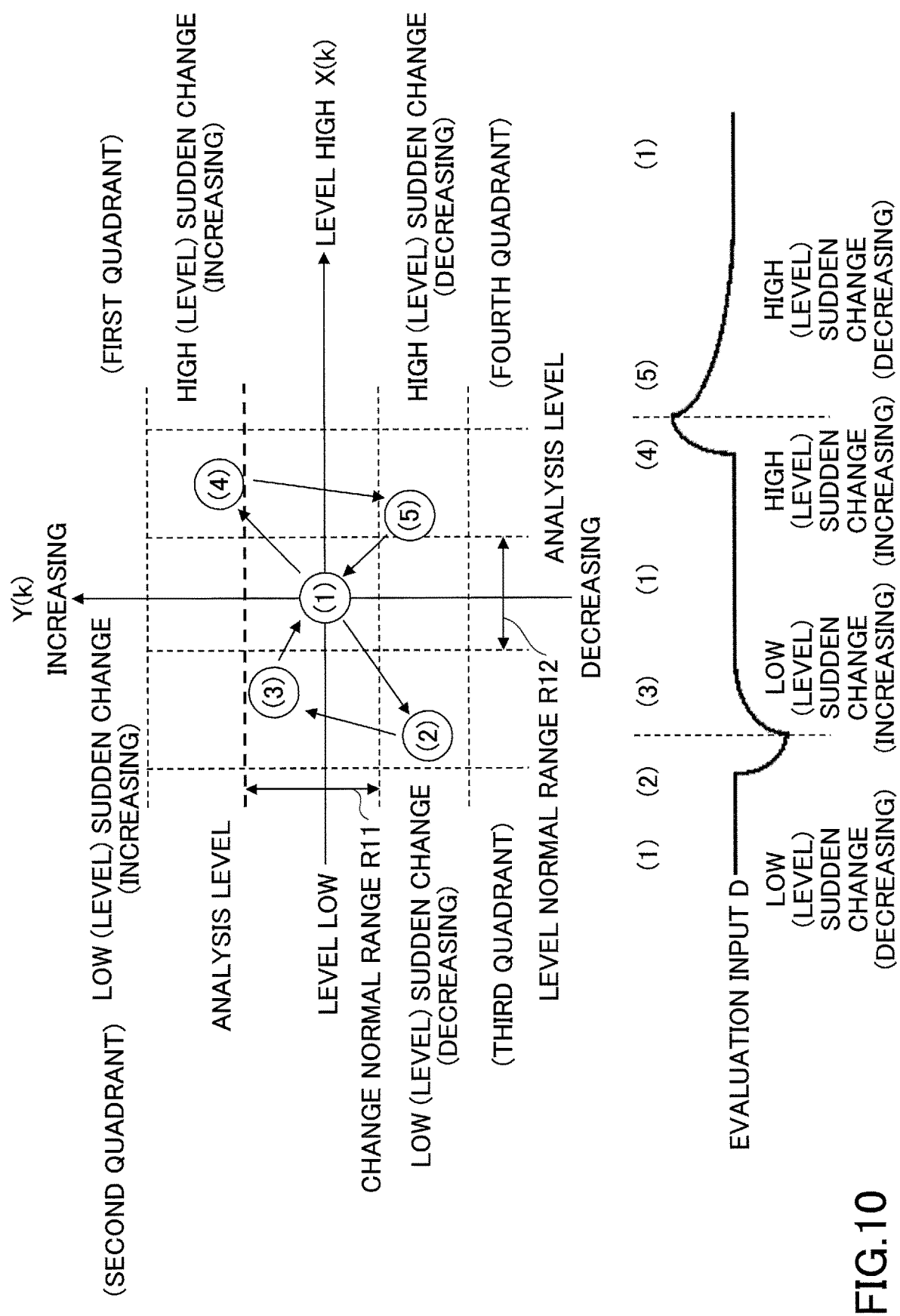
FIG. 10 is a drawing illustrating, as an analysis example by the second analysis unit 49, an example of plotting of the Cartesian coordinates in the case where an evaluation input D changes.

FIG. 9 is a flowchart illustrating operations of the second analysis unit 49. FIG. 10 is a drawing illustrating, as an analysis example by the second analysis unit 49, an example of plotting of the Cartesian coordinates in the case where an evaluation input D changes.

The evaluation input D illustrated in FIG. 10 is any one of, for example, a detection value of the direct current (DC) voltage 11, the direct current (DC) current 12, the direct current (DC) intermediate voltage 13, the charging and discharging current 10, or the like, a value obtained by applying RMS (root mean square) conversion to the alternating current (AC) input current 16, the alternating current (AC) output voltage 20, or the like, and the control adjustment value 34.

In step S110, the second analysis unit 49 obtains sample values of the evaluation input D (data D(k)).

In step S120, the second analysis unit 49 calculates a deviation $\Delta D(k)$ by subtracting a command value $R(k)$ from the data D(k). The command value R(k) is the control command value 30 illustrated in FIG. 2.

In step S130, the second analysis unit 49 calculates a summation value X(k) by calculating the summation of the deviation ΔD(k).

In step S140, the second analysis unit 49 calculates a summation value Y(k) by calculating a summation of differences of the deviation ΔD(k).

In step S150, the second analysis unit 49 converts X(k) and Y(k) into a value that can be plotted in the Cartesian coordinates by multiplying each of X(k) calculated in step S130 and Y(k) calculated in step S140 with a parameter (standardization/normalization parameter) Wn, and plots the converted value on Cartesian coordinates. In Wn, "n" is a natural number equal to or greater than one (1) and indicates an analysis number (the number of analyses).

In step S160, the second analysis unit 49 determines whether the data plotted in step S150 is within a normal range illustrated in FIG. 10 or is outside the normal range. The normal ranges (a change normal range R11 and a level normal range R12) are calculated taking into account the operation state of the power converter 1, the manufacturing error of the power converter 1, the detection error of each of the sensors, etc., and are preset in the second analysis unit 49. Dotted lines indicating an upper limit and a lower limit of each of the change normal range R11 and the level normal range R12 in the present description are illustrated as straight lines. However, they are not limited to the straight lines but may be curved lines.

The second analysis unit 49 stops processing in the case where it is determined that the data is within the normal range (step S160, Yes). The second analysis unit 49 performs processing of step S170 in the case where it is determined that the data is outside the normal range (step S160, No).

In step S170, the second analysis unit 49 determines which quadrant of Cartesian coordinates, the first quadrant, the second quadrant, the third quadrant, or the fourth quadrant, the data is in. Further, in step S170, the second analysis unit 49 calculates a distance ZB from the data, which is determined to be outside the normal range, to the normal range (distance from the normal range). In other words, the second analysis unit 49 calculates how far the plotted data is away from the normal range, and inputs the distance information 70 as a calculation result to the cause identifying unit 55.

A specific example will be described using FIG. 10. In Cartesian coordinates illustrated in FIG. 10, an X-axis direction indicates a level of the direct current (DC) voltage 11, the direct current (DC) current 12, the direct current (DC) intermediate voltage 13, or the like. A positive X-axis direction indicates that the level is high, and a negative X-axis direction indicates that the level is low.

The Y-axis direction indicates increasing or decreasing tendency of a level of the direct current (DC) voltage 11, the direct current (DC) current 12, the direct current (DC) intermediate voltage 13, or the like. A positive Y-axis direction indicates the increasing tendency of the level, and a negative Y-axis direction indicates the decreasing tendency of the level.

The first quadrant is an area indicating that the detected data level is high and has increased suddenly. The second quadrant is an area indicating that the detected data level is low and has decreased suddenly. The third quadrant is an area indicating that the detected data level has increased suddenly from a low level. The fourth quadrant is an area indicating that the detected data level has decreased suddenly from a high level.

The change normal range R11 indicates a range indicating that the level change is normal, and the level normal range R12 is a range indicating that the level is normal. The change normal range R11 and the level normal range R12 are preset.

Numbers from (1) to (5) in Cartesian coordinates illustrated in FIG. 10 correspond to the numbers illustrated on the lower side of FIG. 10. An example of the evaluation input D is illustrated on the lower side of FIG. 10. The evaluation input D is, for example, the direct current (DC) voltage 11. The vertical axis indicates a voltage value and the horizontal axis indicates time.

The direct current (DC) voltage 11 indicated by the number (1) in FIG. 10 is the rectification constant value.

The direct current (DC) voltage 11 indicated by the number (2) in FIG. 10 is decreasing gradually. The direct current (DC) voltage 11 indicated by the number (2) is located in the third quadrant and is located outside the change normal range R11 and the level normal range R12.

The direct current (DC) voltage 11 indicated by the number (3) in FIG. 10 indicates that the level is low and is increasing. The direct current (DC) voltage 11 indicated by the number (3) is located in the second quadrant and is located within the change normal range R11 and outside the level normal range R12.

The direct current (DC) voltage 11 indicated by the number (4) in FIG. 10 indicates that the level is high and is increasing. The direct current (DC) voltage 11 indicated by the number (4) is located in the first quadrant and is located outside the change normal range R11 and the level normal range R12.

The direct current (DC) voltage 11 indicated by the number (5) in FIG. 10 indicates that the level is high and is decreasing. The direct current (DC) voltage 11 indicated by the number (5) is located in the fourth quadrant and is located outside the change normal range R11 and the level normal range R12.

In Cartesian coordinates illustrated in FIG. 10, the data items of the direct current (DC) voltage 11 are plotted in the order of the numbers (1), (2), (3), (1), (4), (5), and (1).

The data items of the numbers (2) to (5) of the direct current (DC) voltage 11 are located outside the normal range, and thus, in step S180, the second analysis unit 49 determines that some abnormality has occurred, and outputs a result of abnormality determination as the abnormality determination information 53. The abnormality determination information 53 is input to each of the state analysis data recording unit 56, the sensor waveform recording unit 57, and the alarm unit 58.

It should be noted that the second analysis unit 49 may generate trajectory information indicating the data trajectory that transitions in the order of the numbers (1), (2), (3), (1), (4), (5), and (1), and may input the generated trajectory information to the state analysis data recording unit 56. Further, the display unit 60 may visualize and display the data trajectory based on the trajectory information recorded in the state analysis data recording unit 56. According to the above arrangement, it is possible for a user to understand the detailed change transition of the direct current (DC) voltage 11, or the like. It should be noted that it is possible to understand the change transition easily and in detail by using the second analysis unit 49 in the case where a disorder occurs in external environments of the power converter 1. The disorder includes a case in which the load 22, to which the power from the power converter 1 is supplied, has started or stopped suddenly, a case in which an abnormality occurs in the chopper 5, etc. Further, it is possible to understand the change transition easily and in detail by visualizing the trajectory because the visualized trajectory enables a user to understand the change transition at a glance as compared with a case in which a user studies the rectification constant value in a graph with time axis.

[Third Analysis Unit 50]

Next, operations of the third analysis unit 50 will be described. The third analysis unit 50 generates information used for abnormality cause identification by the cause identifying unit 55, by analyzing the change of the alternating current (AC) input voltage 15, the alternating current (AC) input current 16, the alternating current (AC) output current 19, the alternating current (AC) output voltage 20, or the like, using Fast Fourier transform (FFT), and by plotting the analysis result in Cartesian coordinates. It is possible to analyze disorders that occur in the power converter 1 by using the third analysis unit 50.

Figure 11:
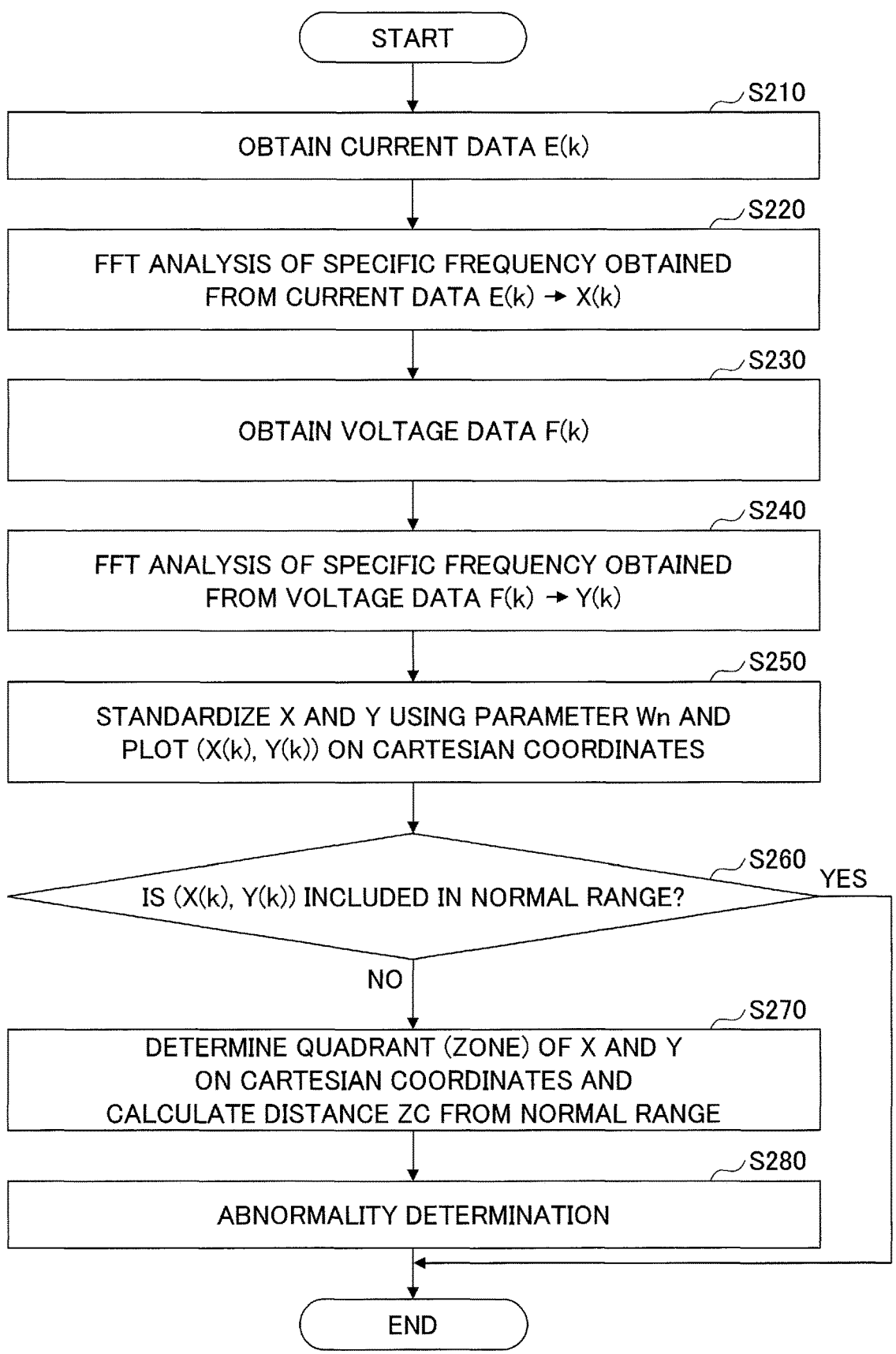
FIG. 11 is a flowchart illustrating operations of a third analysis unit 50.
Figure 12:
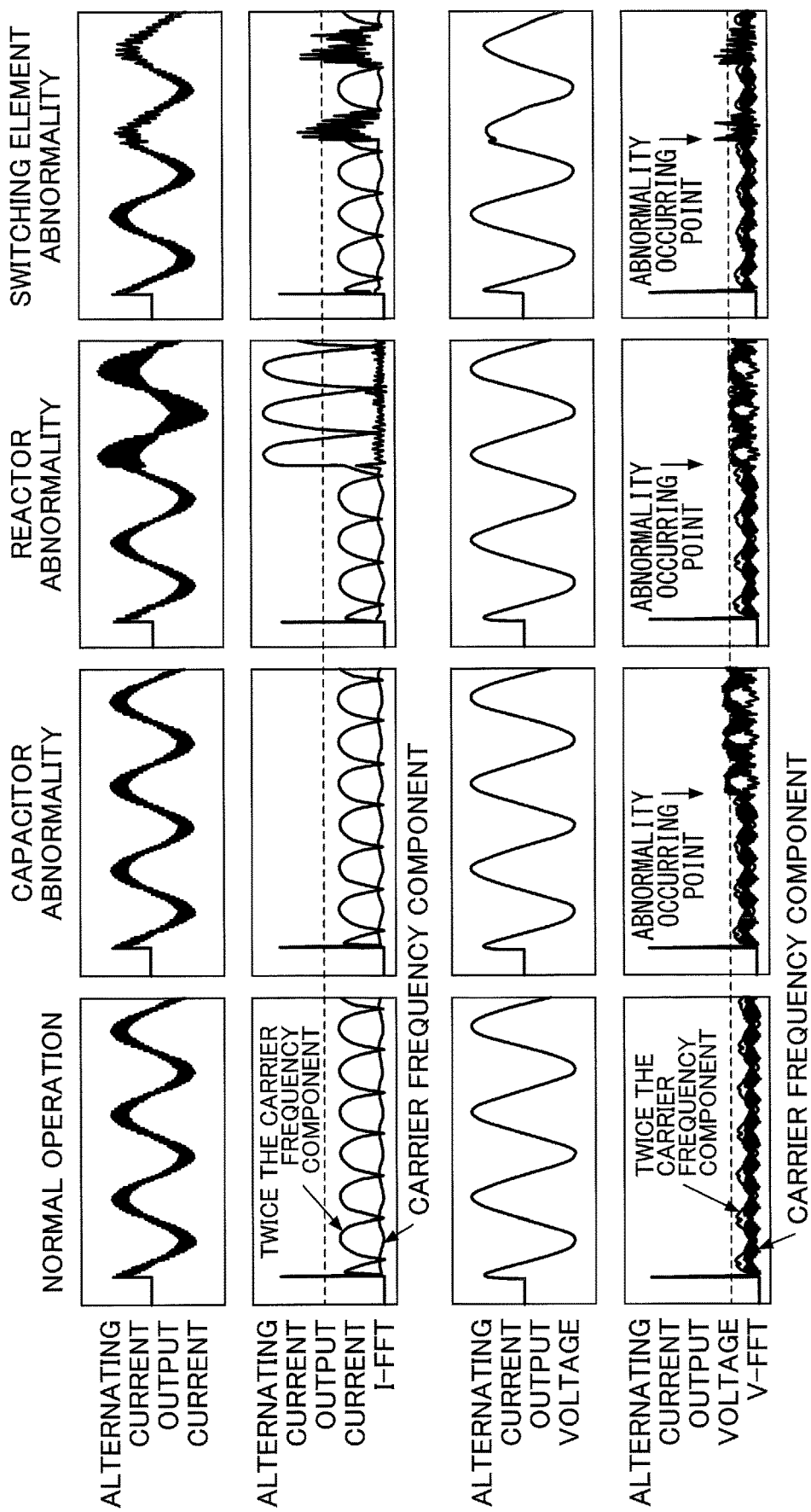
FIG. 12 is a first drawing illustrating a specific example of operations of the third analysis unit 50.
Figure 13:
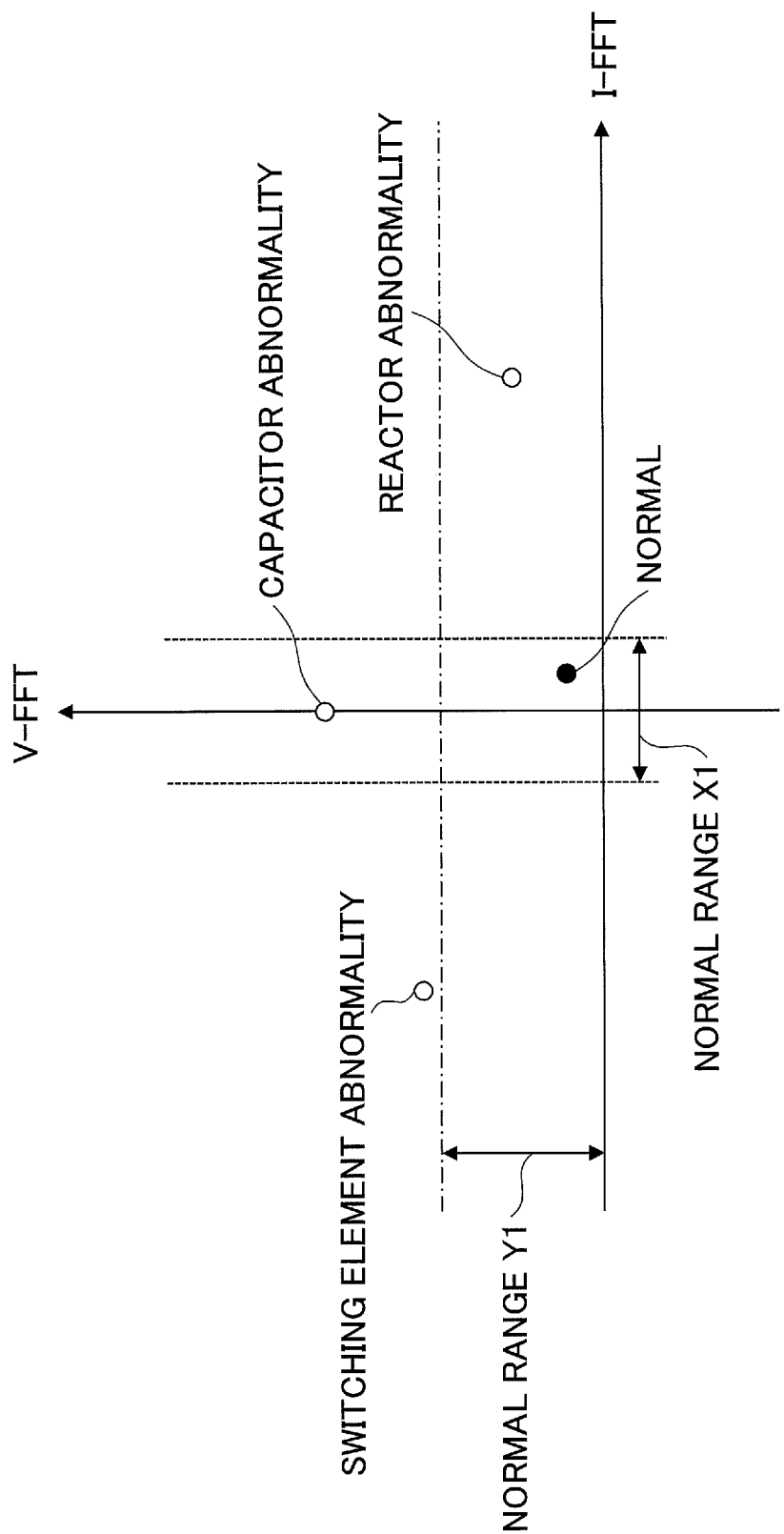
FIG. 13 is a second drawing illustrating a specific example of operations of the third analysis unit 50.

FIG. 11 is a flowchart illustrating operations of the third analysis unit 50. FIG. 12 is a first drawing illustrating a specific example of operations of the third analysis unit 50. FIG. 13 is a second drawing illustrating a specific example of operations of the third analysis unit 50.

FIG. 12 illustrates, from top to bottom, a waveform of the alternating current (AC) output current, an analysis result according to the Fast Fourie transform (I-FFT) of the alternating current (AC) output current, a waveform of the alternating current (AC) output voltage, and an analysis result according to the Fast Fourie transform (I-FFT) of the alternating current (AC) output voltage. It should be noted that the horizontal axis indicates time. In an embodiment of the present invention, a carrier frequency component and a frequency component with twice the carrier frequency are indicated. However, the frequency component is not limited to the above and may be any frequency component as long as it is an integer multiple of the carrier frequency.

FIG. 12 illustrates, for example, a waveform of each of the alternating current (AC) output current and the alternating current (AC) output voltage when the power converter 1 is operating normally, and a waveform of each of the alternating current (AC) output current and the alternating current (AC) output voltage when an abnormality has occurred in a capacitor included in the power converter 1. Further, FIG. 12 illustrates a waveform of each of the alternating current (AC) output current and the alternating current (AC) output voltage when an abnormality has occurred in a reactor included in the power converter 1, and a waveform of each of the alternating current (AC) output current and the alternating current (AC) output voltage when an abnormality has occurred in a switching element (e.g., semiconductor switching element included in the inverter 3).

In step S210, the third analysis unit 50 obtains sample values of the evaluation input E (data E(k)). The evaluation input E corresponds to, for example, the alternating current (AC) output current illustrated in FIG. 12.

In step S220, the third analysis unit 50 performs FFT analysis of a specific frequency for the current data E(k). According to the above arrangement, a level of a frequency component with twice (for example) the switching frequency of the switching element included in the inverter 3 is detected, for example. The above level detection result is shown as I-FFT in FIG. 12, and corresponds to a value (X(k)) in the X-axis of Cartesian coordinates in FIG. 13.

In step S230, the third analysis unit 50 obtains sample values of the evaluation input F (voltage data F(k)). The evaluation input F corresponds to, for example, the alternating current (AC) output voltage illustrated in FIG. 12.

In step S240, the third analysis unit 50 performs FFT analysis of a specific frequency for the voltage data F(k). According to the above arrangement, a level of a frequency component with twice (for example) the switching frequency of the switch element included in the inverter 3 is detected, for example. The above level detection result is shown as V-FFT in FIG. 12, and corresponds to a value (Y(k)) in the Y-axis of Cartesian coordinates in FIG. 13.

When the reactor 8A has a layer short, for example, noise overlaps with the alternating current (AC) output current 19, and thus, the level of the frequency component of I-FFT becomes greater.

When capacitance is decreased due to the deterioration of the filter capacitor 6A, for example, the ripple of the alternating current (AC) output voltage 20 increases and the level of frequency component of V-FFT becomes greater.

For example, when a switching element breaks down, switching operations are not performed normally, and thus, there will be disorders in waveforms of the alternating current (AC) output current 19 and the alternating current (AC) output voltage 20, and thus, the levels of frequency component of I-FFT and V-FFT will be unstable. Further, in the case where parts for generating PWM pulses have deteriorated, some of the PWM pulses may be dropped, and thus, there may be a decreasing tendency on I-FFT (data is plotted in the second quadrant). "In the case where parts for generating PWM pulses have deteriorated" means "in the case where a photo coupler, or the like, has deteriorated", "in the case where malfunction of a gate drive circuit has occurred", etc.

In step S250, the third analysis unit 50 converts X(k) and Y(k) into a value that can be plotted in the Cartesian coordinates by multiplying each of the analysis result X(k) in step S220 and the analysis result Y(k) in step S240 with a parameter (standardization/normalization parameter) Wn, plots the converted value in the Cartesian coordinates. "n" is a natural number equal to or greater than one (1) and indicates an analysis number (the number of analyses). It should be noted that X(k) and Y(k) are average values, with respect to components with twice the carrier frequency, in a half cycle in an embodiment of the present invention. It should be noted that, when plotting in Cartesian coordinates in an embodiment of the present invention, average values of X(k) and Y(k) are subtracted from X(k) and Y(k) so that the average values are plotted on the zero point.

In step S260, the third analysis unit 50 determines whether the data plotted in step S250 is within a normal range (within a normal range X1 and within a normal range Y1) illustrated in FIG. 13 or is outside the normal range. The normal range X1 is a normal range for the I-FFT analysis result and the normal range Y1 is a normal range for the V-FFT analysis result. These normal ranges are calculated by taking into account manufacturing errors of parts included in the power converter 1, usage environments, etc., and are preset in the third analysis unit 50.

The third analysis unit 50 stops processing in the case where it is determined that the data is within the normal range (step S260, Yes). The third analysis unit 50 performs processing of step S270 in the case where it is determined that the data is outside the normal range (step S260, No).

In step S270, the third analysis unit 50 determines whether the data determined to be outside the normal range is in the first quadrant or in the second quadrant of Cartesian coordinates. Further, in step S270, the third analysis unit 50 calculates a distance ZC from the data, which is determined to be outside the normal range, to the normal range (distance from the normal range). In other words, the third analysis unit 50 calculates how far the plotted data is away from the normal range, and inputs the distance information 70 as a calculation result to the cause identifying unit 55. One of the reasons for determining whether the data is in the first quadrant or in the second quadrant is that although harmonic components are basically absorbed by a filter that is consist of a reactor 8A and a filter capacitor 6A, a certain value is output from the filter. Therefore, it is a rare case in which the date is plotted on the negative side of V-FFT.

Data items of "reactor abnormality", "capacitor abnormality", "switching element abnormality", etc., illustrated in FIG. 13 are plotted outside the normal range, and thus, in step S280, the third analysis unit 50 determines that some abnormality has occurred and outputs a result of abnormality determination as the abnormality determination information 53. The abnormality determination information 53 is input to each of the state analysis data recording unit 56, the sensor waveform recording unit 57, and the alarm unit 58.

[Fourth Analysis Unit 51]

Next, operations of the fourth analysis unit 51 will be described. When charging operations, alternating current (AC) operations (at the time of full charge), input limited operations, direct current (DC) operations, etc., are performed, for example, it is possible to detect a direct current (DC) short circuit, a battery abnormality, an inverter abnormality, etc., by analyzing the direction and the level of the power flowing in the power converter 1. The fourth analysis unit 51 generates information used for abnormality cause identification by the cause identifying unit 55 by calculating the direction and the level of the power flowing in the power converter 1 and plotting the calculated result in Cartesian coordinates. It is possible to analyze abnormalities that occur inside the power converter 1 or in external environments of the power converter 1 by using the fourth analysis unit 51. It should be noted that the power may include at least one of active power and reactive power, and may be an instantaneous value, or an average power value in a constant period.

Figure 14:
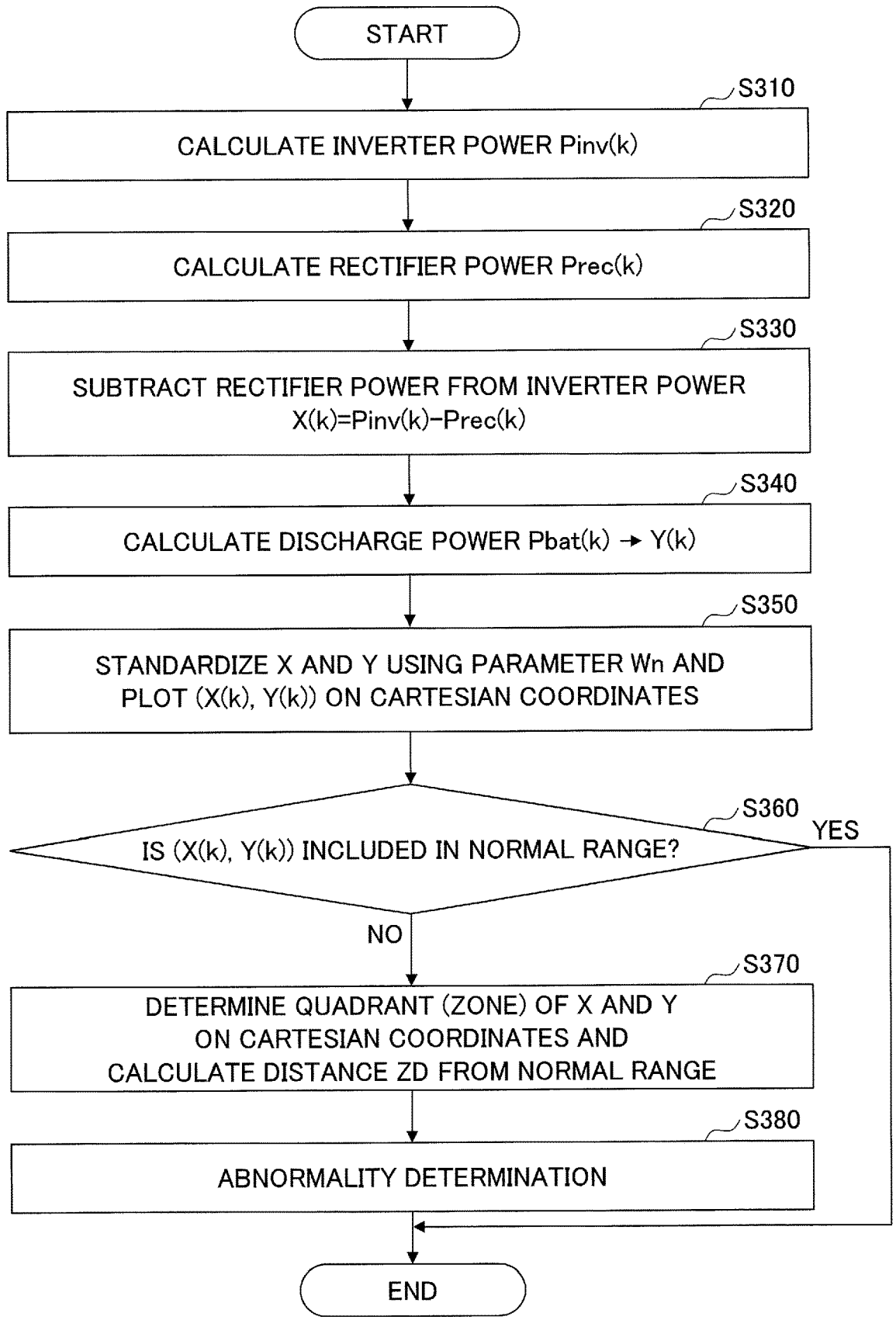
FIG. 14 is a flowchart illustrating operations of a fourth analysis unit 51.
Figure 15:
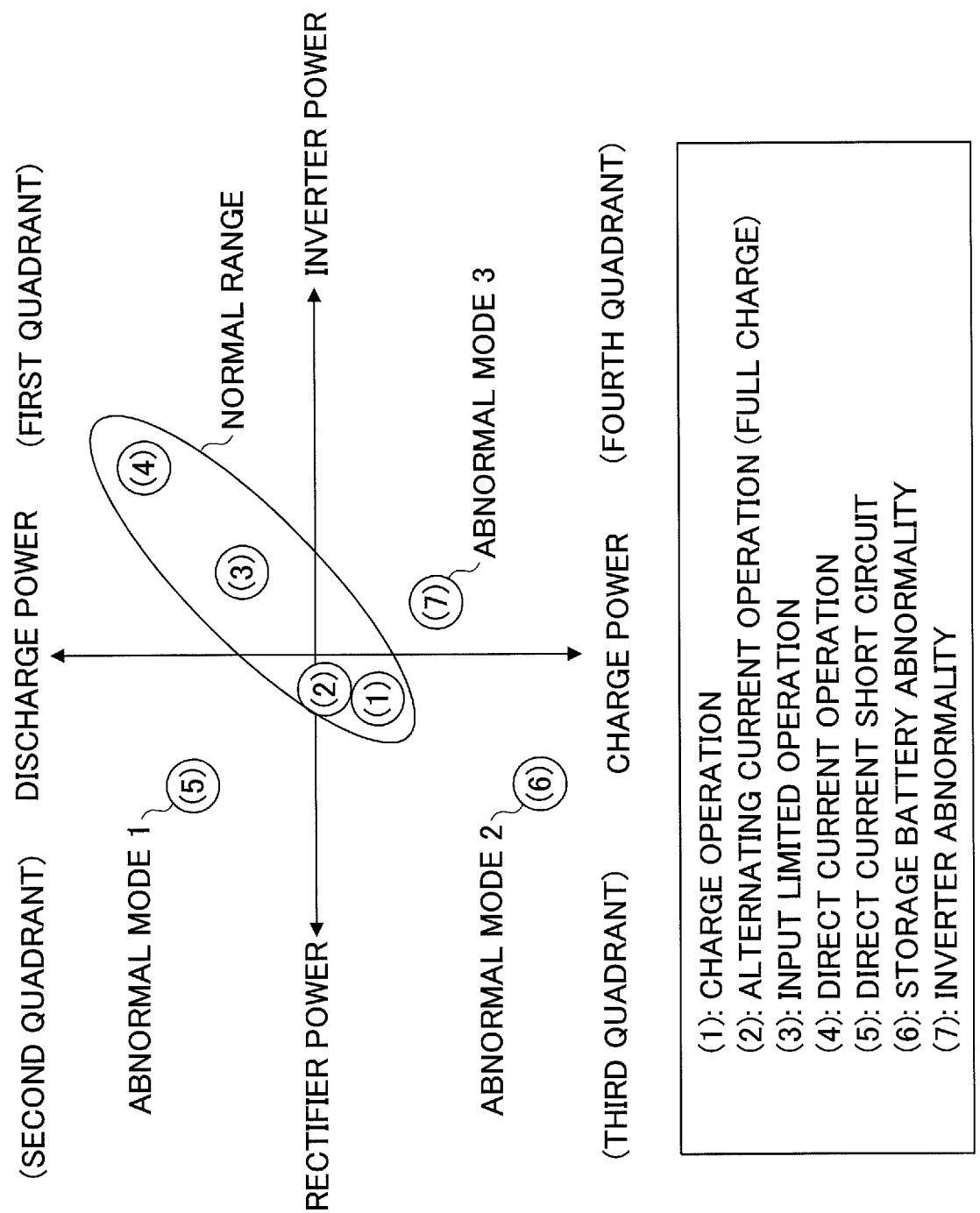
FIG. 15 is a drawing illustrating a specific example of operations of the fourth analysis unit 51.

FIG. 14 is a flowchart illustrating operations of the fourth analysis unit 51. FIG. 15 is a drawing illustrating a specific example of operations of the fourth analysis unit 51.

The X-axis of Cartesian coordinates illustrated in FIG. 15 indicates a power flow between the inverter 3 and the rectifier 4. A positive X-axis direction indicates an area in which power flowing in the inverter 3 is greater than power flowing in the rectifier 4. A negative X-axis direction indicates an area in which power flowing in the rectifier 4 is greater than power flowing in the inverter 3. It should be noted that positive power and negative power are defined by assuming outputs of the rectifier 4, the inverter 3, and the chopper 5 are performed in a positive direction of the coordinates illustrated in FIG. 15. For example, in the case where alternating current (AC) input power from the power reception device 24 flows into the rectifier 4, the direction is opposite with respect to the axis of the rectifier 4, and thus, it is handled as a negative value.

The Y-axis of Cartesian coordinates illustrated in FIG. 15 indicates the level of discharging power or the charging power of the storage battery 23. A positive Y-axis direction indicates an area in which the discharging power of the storage battery 23 is greater than the charging power. A negative Y-axis direction indicates an area in which the charging power of the storage battery 23 is greater than the discharging power.

A number (1) illustrated in FIG. 15 is plotted data based on data detected by the power converter 1 that is operating in a charging operation mode.

In case of the charging operation mode, power is stored in the storage battery 23 by performing down voltage operation of the chopper 5. Therefore, The plotted data indicated by the number (1) is located in the third quadrant near the intersection of X-axis and Y-axis.

A number (2) illustrated in FIG. 15 is plotted data based on data detected by the power converter 1 that is operating in an alternating current (AC) operation mode at the time of full charge.

In case of the alternating current (AC) operation mode, although there is no power directed to the storage battery 23 from the chopper 5, because of a full charge state, there are power losses in the inverter 3, the rectifier 4, the chopper 5, or the like, and thus, the plotted data indicated by the number (2) is located at a position slightly shifted from the intersection of X-axis and Y-axis in the negative X-axis direction.

A number (3) illustrated in FIG. 15 is plotted data based on data detected by the power converter 1 that is operating in a input limited mode.

In case of the input limited mode, input power at the rectifier 4 is limited, and the shortage is compensated by the discharge power from the storage battery 23, and thus, the plotted data indicated by the number (3) is located in the first quadrant at a certain distance from the intersection of X-axis and Y-axis in the positive X-axis direction and in the positive Y-axis direction.

A number (4) illustrated in FIG. 15 is plotted data based on data detected by the power converter 1 that is operating in a direct current (DC) operation mode.

In case of the direct current (DC) mode, the rectifier 4 is stopped and a power source is discharge power of the storage battery 23, and thus, the plotted data indicated by the number (4) is located in the first quadrant at a certain distance from the plotted position of the number (3) in the positive X-axis direction and in the positive Y-axis direction.

A solid line surrounding the plotted data items indicated by the numbers (1) to (4) in Cartesian coordinates indicates a normal range.

A number (5) illustrated in FIG. 15 is plotted data based on data detected at the time of direct current (DC) short circuit (abnormal mode 1).

In the case where a short circuit is caused to a direct current (DC) bus provided between the chopper 5 and the inverter 3, for example, the fourth analysis unit 51 plots data at a position indicated by the abnormal mode 1 in Cartesian coordinates, that is, a position in the second quadrant beyond the normal range. According to the above arrangement, it is possible for a user to understand that the direct current (DC) short circuit has occurred in the power converter 1.

A number (6) illustrated in FIG. 15 is plotted data based on data detected at the time of storage battery abnormality (abnormal mode 2).

In the case where a short circuit is caused to a terminal of the storage battery 23 or cables connected to the storage battery 23 are mis-wired when replacing the storage battery 23, the fourth analysis unit 51 plots data at a position indicated by an abnormal mode 2 in Cartesian coordinates, that is, a position in the third quadrant beyond the normal range. According to the above arrangement, it is possible for a user to understand that the short circuit has occurred in the storage battery 23.

A number (7) illustrated in FIG. 15 is plotted data based on data detected at the time of inverter abnormality (abnormal mode 3).

In the case where an abnormality occurs in a switching element of the inverter 3, for example, the fourth analysis unit 51 plots data at a position indicated by the abnormal mode 3 in Cartesian coordinates, that is, a position in the fourth quadrant beyond the normal range. According to the above arrangement, it is possible for a user to understand that some abnormality has occurred in the inverter 3.

In step S310, the fourth analysis unit 51 calculates the inverter power Pinv(k).

In step S320, the fourth analysis unit 51 calculates the rectifier power Prec(k).

In step S330, the second analysis unit 51 calculates the power deviation X(k) by subtracting the rectifier power Prec(k) from the inverter power Pinv(k).

In step S340, the fourth analysis unit 51 calculates the discharge power Pbat(k) using the evaluation input data 45, and calculates a Y-axis value Y(k) from the calculated discharge power Pbat(k). For example, at the time of discharging, the discharge power Pbat(k) is a positive value (positive Y-axis direction), and, at the time of charging, the discharge power Pbat(k) is a negative value (negative Y-axis direction).

In step S350, the fourth analysis unit 51 converts X(k) and Y(k) into a value that can be plotted in the Cartesian coordinates by multiplying each of X(k) calculated in step S330 and Y(k) calculated in step S340 with a parameter (standardization/normalization parameter) Wn, and plots the converted value in the Cartesian coordinates. "n" is a natural number equal to or greater than one (1) and indicates an analysis number (the number of analyses).

In step S360, the fourth analysis unit 51 determines whether the data plotted in step S350 is within a normal range illustrated in FIG. 15 or is outside the normal range.

The normal range is calculated by taking into account manufacturing errors of parts included in the power converter 1, usage environments, etc., and are preset in the fourth analysis unit 51.

The fourth analysis unit 51 stops processing in the case where it is determined that the data is within the normal range (step S360, Yes). The fourth analysis unit 51 performs processing of step S370 in the case where it is determined that the data is outside the normal range (step S360, No).

In step S370, the fourth analysis unit 51 determines which quadrant of the Cartesian coordinates the data determined to be outside the normal range is in. Further, in step S370, the fourth analysis unit 51 calculates a distance ZD from the data, which is determined to be outside the normal range, to the normal range (distance from the normal range). In other words, the fourth analysis unit 51 calculates how far the plotted data is away from the normal range, and inputs the distance information 70 as a calculation result to the cause identifying unit 55.

Data items indicated by numbers (5), (6), and (7) illustrated in FIG. 15 are plotted outside the normal range, and thus, in step S380, the fourth analysis unit 51 determines that some abnormality has occurred and outputs a result of abnormality determination as the abnormality determination information 53. The abnormality determination information 53 is input to each of the state analysis data recording unit 56, the sensor waveform recording unit 57, and the alarm unit 58.

[Fifth Analysis Unit 52]

Next, operations of the fifth analysis unit 52 will be described. For example, in the case where a harmonic generation load is operated as the load 22, in the case where power consumption greatly decreases in a short period of time because the load 22 with large capacity is stopped, or in the case where power consumption greatly increases in a short period time because the load 22 with large capacity is started, the fifth analysis unit 52 is configured to identify an abnormality cause by analyzing changes of a load current and a load voltage caused by the change of the load 22. The harmonic generation load is a load that generates harmonic in accordance with power reception from an alternating current (AC) power supply such as the power reception device 24, and is a power converter, a power storage device, etc.

Figure 16:
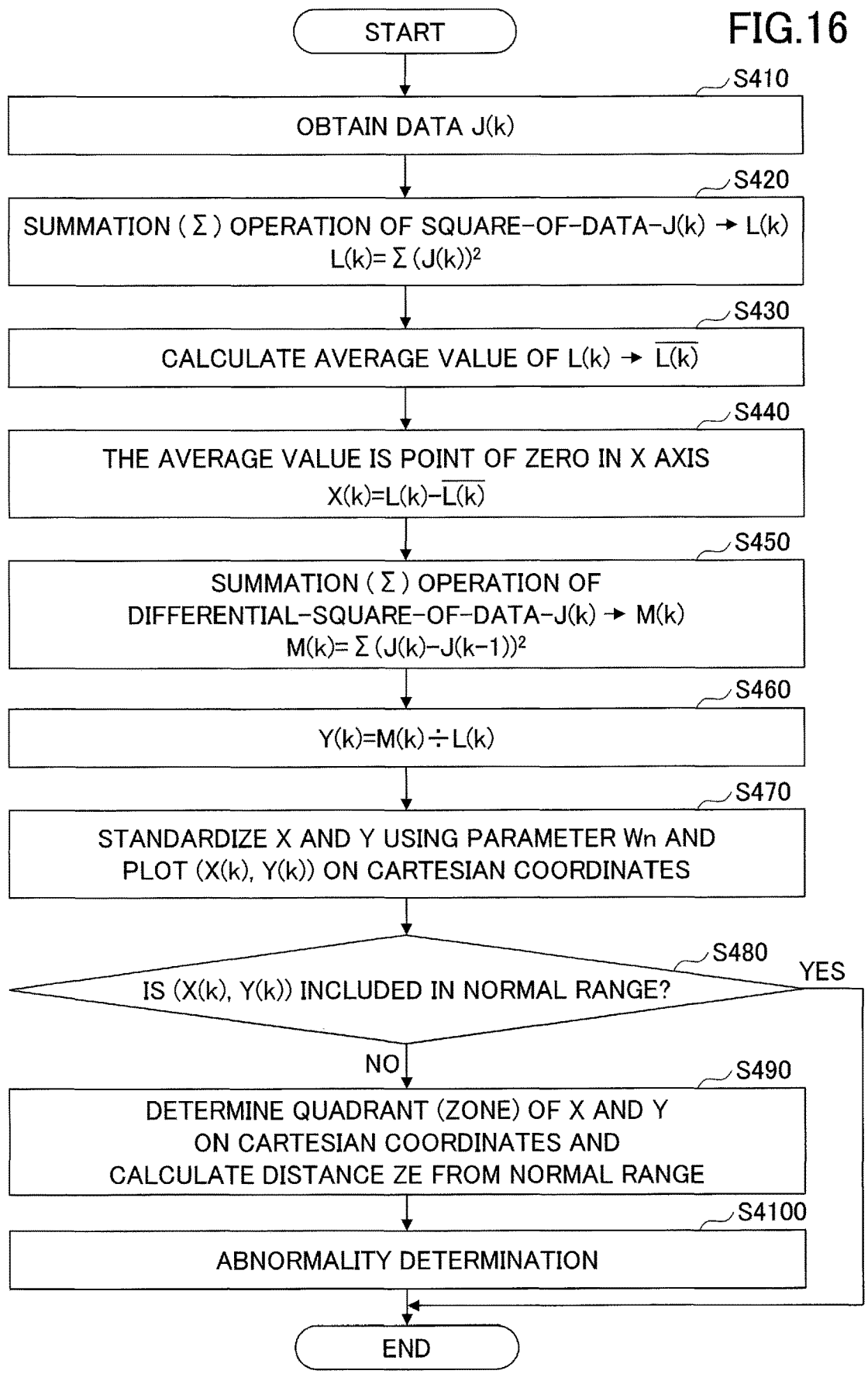
FIG. 16 is a flowchart illustrating operations of a fifth analysis unit 52.
Figure 17:
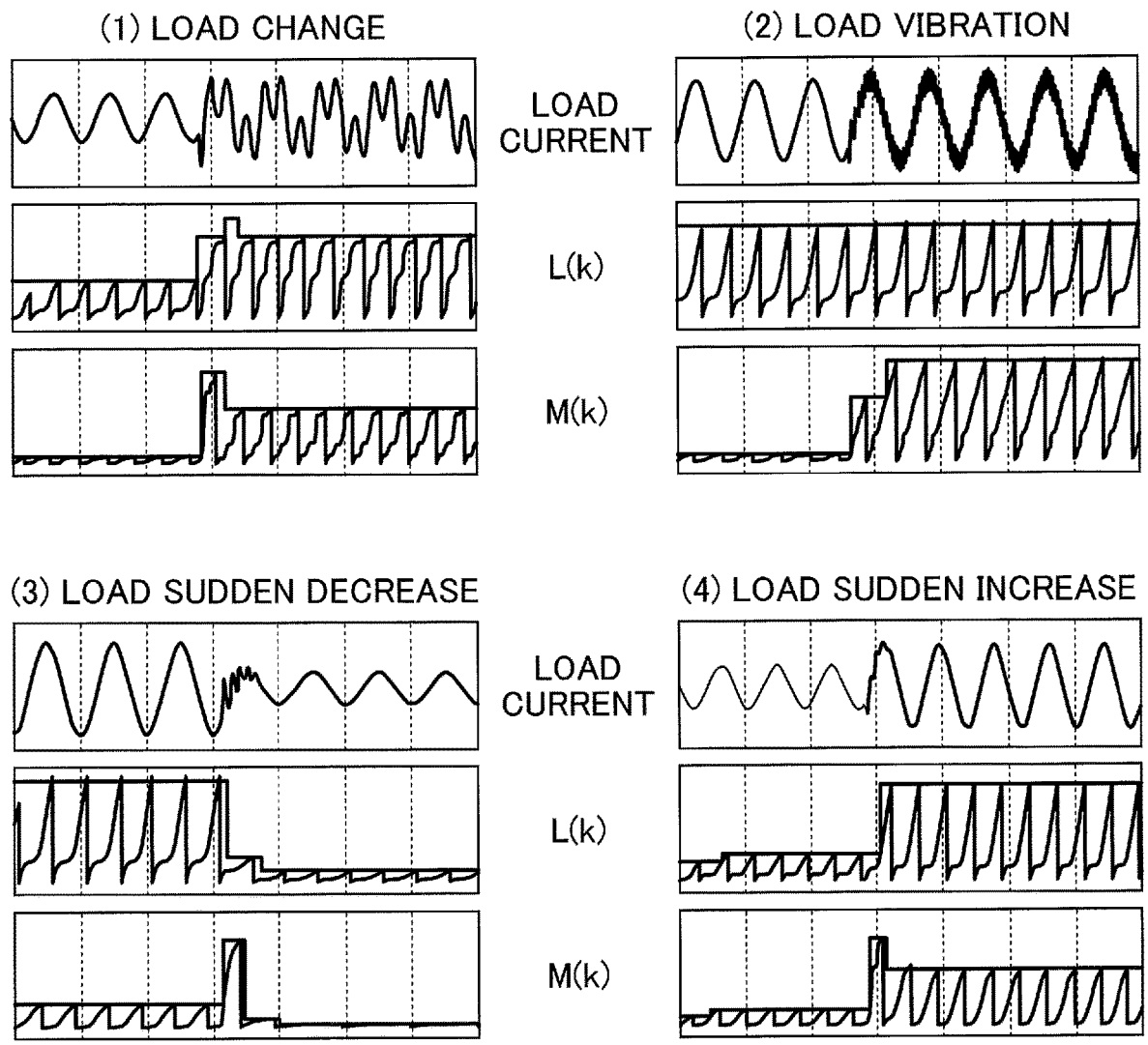
FIG. 17 is a first drawing illustrating a specific example of operations of the fifth analysis unit 52.

FIG. 16 is a flowchart illustrating operations of the fifth analysis unit 52. FIG. 17 is a first drawing illustrating a specific example of operations of the fifth analysis unit 52. FIG. 17 illustrates four examples of the change of load current in accordance with load change.

"Load change" indicated by a number (1) indicates a waveform of a load current when a specific type of load 22 connected to the power converter 1 is changed by (replaced with) a type of load 22 different from the specific type of load 22. "Load change" means, for example, a change from a linear load to a non-linear load.

"Load vibration" indicated by a number (2) indicates a waveform of a load current in the case where a harmonic occurs at the load 22 such as a server.

"Load sudden decrease" indicated by a number (3) indicates a waveform of a load current in the case where the power consumption greatly decreases in a short period of time because a load 22 with large capacity is stopped, for example.

"Load sudden increase" indicated by a number (4) indicates a waveform of a load current in the case where the power consumption greatly increases in a short period of time because a load 22 with large capacity is started, for example.

Figure 18:
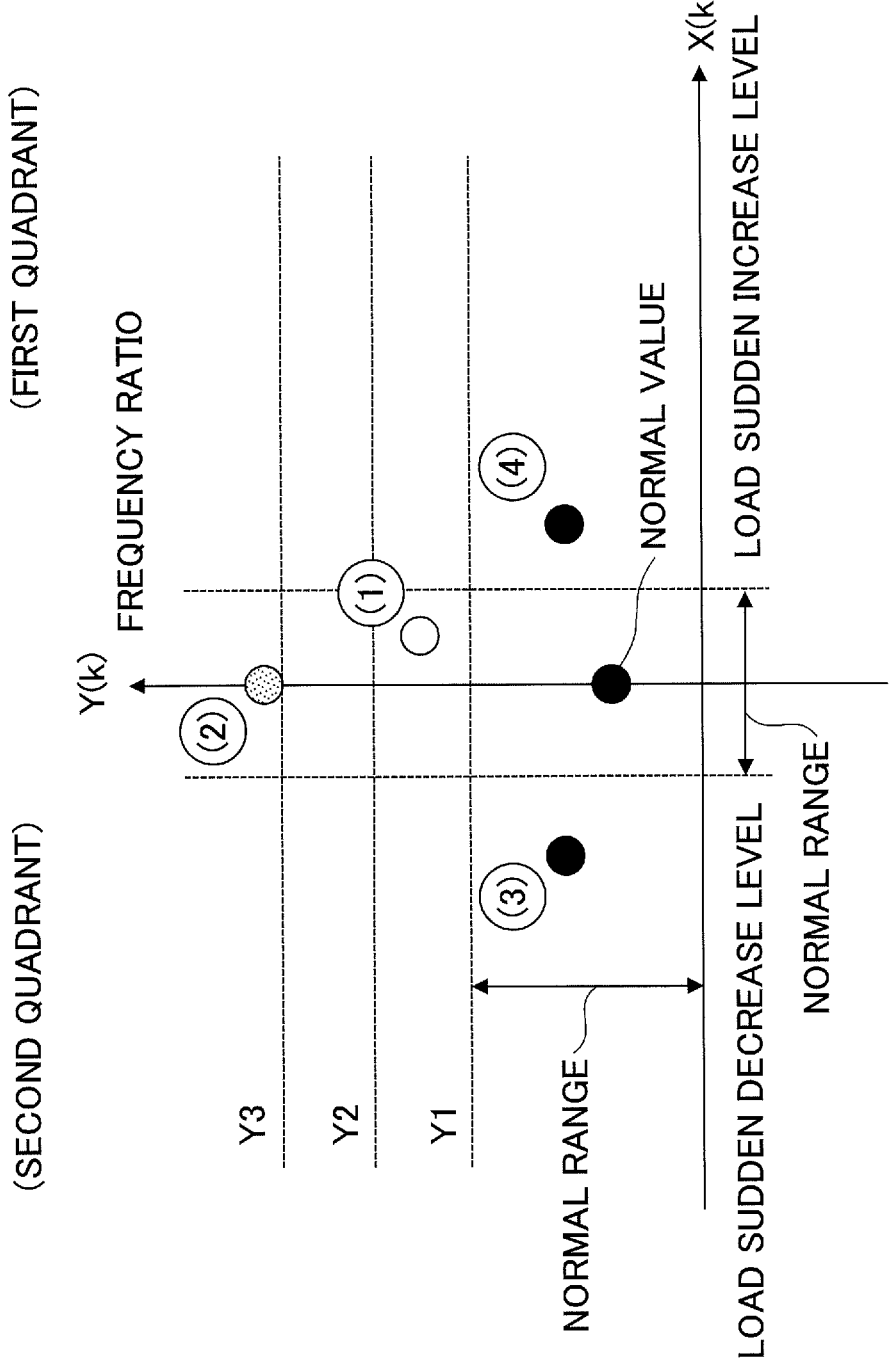
FIG. 18 is a second drawing illustrating a specific example of operations of the fifth analysis unit 52.

FIG. 18 is a second drawing illustrating a specific example of operations of the fifth analysis unit 52. In Cartesian coordinates of FIG. 18, analysis results of waveforms illustrated in FIG. 17 are illustrated. Data indicated by (1) in FIG. 18 corresponds to the load current at the time of "load change" in FIG. 17. Similarly, data indicated by (2) corresponds to the load current at the time of "load vibration" in FIG. 17. Data indicated by (3) corresponds to the load current at the time of "load sudden decrease" in FIG. 17. Data indicated by (4) corresponds to the load current at the time of "load sudden increase" in FIG. 17.

Y1 through Y3 are determination areas for determining abnormality levels. The change rate of the level becomes greater in the order of Y1, Y2, and Y3.

Data (1) is plotted within a normal range in the positive X-axis direction and within Y1 in the positive Y-axis direction in the first quadrant of Cartesian coordinates.

Data (2) is plotted within the normal range in the positive X-axis direction and within Y3 in the positive Y-axis direction at the boundary part between the first quadrant and the second quadrant of Cartesian coordinates.

Data (3) is plotted out of the normal range in the negative X-axis direction and within the normal range in the positive Y-axis direction in the second quadrant of Cartesian coordinates.

Data (4) is plotted out of the normal range in the positive X-axis direction and within the normal range in the positive Y-axis direction in the first quadrant of Cartesian coordinates.

In step S410, the fifth analysis unit 52 obtains sample values (data J(k)). The sample values (data J(k)) are the load current 21. It should be noted that the sample values (data J(k)) may be the alternating (AC) output current 19 or the alternating current (AC) input current 16 instead of the load current 21. In an embodiment of the present invention, descriptions will be provided by assuming that the sample values (data J(k)) are the load current 21.

In step S420, the fifth analysis unit 52 calculates a summation value L(k) by calculating a summation of squared data items. Calculation results are illustrated in FIG. 17.

In step S430, the fifth analysis unit 52 calculates an average value of the summation value L(k) calculated in step S420.

In step S440, the fifth analysis unit 52 performs processing of plotting the average value of the summation value L(k) calculated in step S420 at the zero point of X-axis of Cartesian coordinates by subtracting the average value of the summation value L(k) calculated in step S420 from the summation value L(k) calculated in step S420.

In step S450, the fifth analysis unit 52 calculates a summation value M(k) by calculating the summation of squared data items. The calculation results are illustrated in FIG. 17.

In step S460, the fifth analysis unit 52 calculates a ratio (Y(k)) of the summation value M(k) to the summation value L(k) by dividing the summation value M(k) by the summation value L(k).

In step S470, the fifth analysis unit 52 converts X(k) and Y(k) into a value that can be plotted in the Cartesian coordinates by multiplying each of X(k) calculated in step S440 and Y(k) calculated in step S460 with a parameter (standardization/normalization parameter) Wn, and plots the converted value in the Cartesian coordinates. "n" is a natural number equal to or greater than one (1) and indicates an analysis number (the number of analyses).

In step S480, the fifth analysis unit 52 determines whether the data plotted in step S470 is within a normal range illustrated in FIG. 18 or is outside the normal range.

The fifth analysis unit 52 stops processing in the case where it is determined that the data is within the normal range (step S480, Yes). The fifth analysis unit 52 performs processing of step S490 in the case where it is determined that the data is outside the normal range (step S480, No).

In step S490, the fifth analysis unit 52 determines whether the data determined to be outside the normal range is in the first quadrant or the second quadrant of Cartesian coordinates.

Further, in step S490, the fifth analysis unit 52 calculates a distance ZE from the data, which is determined to be outside the normal range, to the normal range (distance from the normal range). In other words, the fifth analysis unit 52 calculates how far the plotted data is away from the normal range, and inputs the distance information 70 as a calculation result to the cause identifying unit 55.

As illustrated in FIG. 18, data items indicated by numbers (1) and (2) are located outside the normal range, and thus, in step S4100, the fifth analysis unit 52 determines that some abnormality has occurred and outputs a result of abnormality determination as the abnormality determination information 53. The abnormality determination information 53 is input to each of the state analysis data recording unit 56, the sensor waveform recording unit 57, and the alarm unit 58.

[Distance Calculation Method]

Figure 19:
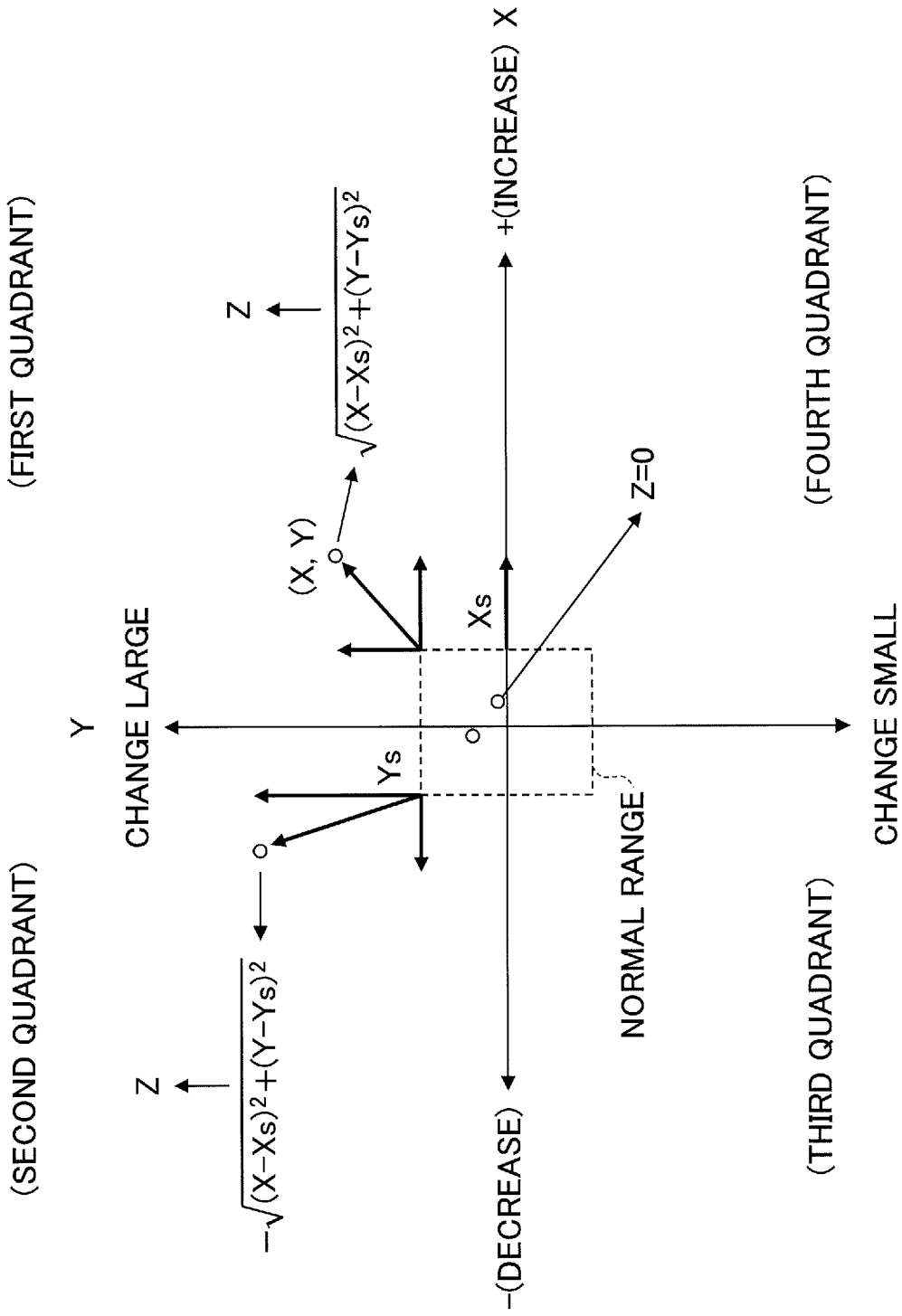
FIG. 19 is a drawing illustrating a calculation method for calculating a distance to a normal range from a plotted point of data determined as an abnormality.

FIG. 19 is a drawing illustrating a calculation method for calculating a distance to a normal range from a plotted point of data determined as an abnormality. The distance Z illustrated in FIG. 19 indicates the distances ZA, ZB, ZC, ZD, and ZD calculated by the first analysis unit 48, etc.

As illustrated in FIG. 19, the distance Z is a value obtained by adding: a square of a difference between an X-axis direction position of the plotted data and an X-axis direction position of the normal range; and a square of a difference between a Y-axis direction position of the data plotted in the first quadrant and a Y-axis direction position of the normal range, and taking a square root of the added squares. It should be noted that a line indicating the normal range illustrated in FIG. 19 is not limited to a rectangular shaped line with four straight side lines, but may be an oval-shaped line, a curved line, or a ring-shaped line, and may be changed depending on the evaluation input data.

[Operations for Determining a Cause of an Abnormality Occurrence by the Cause Identifying Unit 55]

Next, operations of the cause identifying unit 55 will be described. The cause identifying unit 55 performs abnormality cause determination by, for example, setting mode parameters, normalization parameters, weight factors, distances Z, and bias values for each cause determination target in the cause determination formula indicated by (1) below. The weight factors are factors used to change the sensitivity of the analysis data according to the cause determination target.

The Wn shown in the flowcharts of FIG. 5, FIG. 9, FIG. 11, FIG. 14, and FIG. 16 are normalization parameters. In Wn, "n" is a natural number equal to or greater than one (1) and indicates an analysis number (the number of analyses). The normalization parameter Wn is used to normalize the values of voltage, current, power, FFT, and control amount, and the values in the analysis formula of each of Analyses A-E. For X(k) and Y(k) calculated as the above-described analysis values, the cause identifying unit 55 performs processing for converting the values to normalized values as shown in $X(k)=Wn*X(k)$, and $Y(k)=Wn*Y(k)$.

The cause determination formula is composed of the following formula (1) for each number of causes. In order to distinguish corresponding elements in formula (1) below by the subscripts, the following subscripts A, B, C, D, and E shall be used to indicate that corresponding elements in each of the following parameters correspond to respective analyses A, B, C, D, and E, the first analysis unit 48 being analysis A, the second analysis unit 49 being analysis B, the third analysis unit 50 being analysis C, the fourth analysis unit 51 being analysis D, and the fifth analysis unit 52 being analysis E.

Cause determination formula $$Ym = MAm1*WAm1*ZA1 + \ldots + MAmn*WAmn*ZAn + MBm1*WBm1*ZB1 + \ldots + MBmn*WBmn*ZBn + MCm1*WCm1*ZC1 + \ldots + MCmn*WCmn*ZCn + MDm1*WDm1*ZD1 + \ldots + MDmn*WDmn*ZDn + MEm1*WEm1*ZE1 + \ldots + MEmn*WEmn*ZEn - B1 \quad (1)$$

MAmn, MBmn, MCmn, MDmn, and MEmn are mode parameters (operation mode information 65, which is information indicating the contents of the operation mode). A, B, C, D, and E are mode determinations corresponding to respective analyses. The mode parameters are either −1, 0, or 1, depending on the operation mode and the cause determination formula.

The weight factors WAmn, WBmn, WCmn, WDmn, and WEmn are parameters used to adjust the determination accuracy in each determination formula. The weight factors are modified to increase the accuracy of the determination in conjunction with machine learning, or the like. m is a natural number equal to or greater than one (1) and is the number of cause determinations. "n" is a natural number equal to or greater than one (1) and indicates the number of detection analyses.

Distances ZAn, ZBn, ZCn, ZDn, and ZEn are respectively calculated by the first analysis unit 48, the second analysis unit 49, etc. In ZAn, ZBn, ZCn, ZDn, and ZEn, "n" is a natural number equal to or greater than one (1) and indicates an analysis number (the number of analyses).

B1 is a bias value for preventing an incorrect determination obtained by considering errors of each cause determination and noise.

Figure 22B:
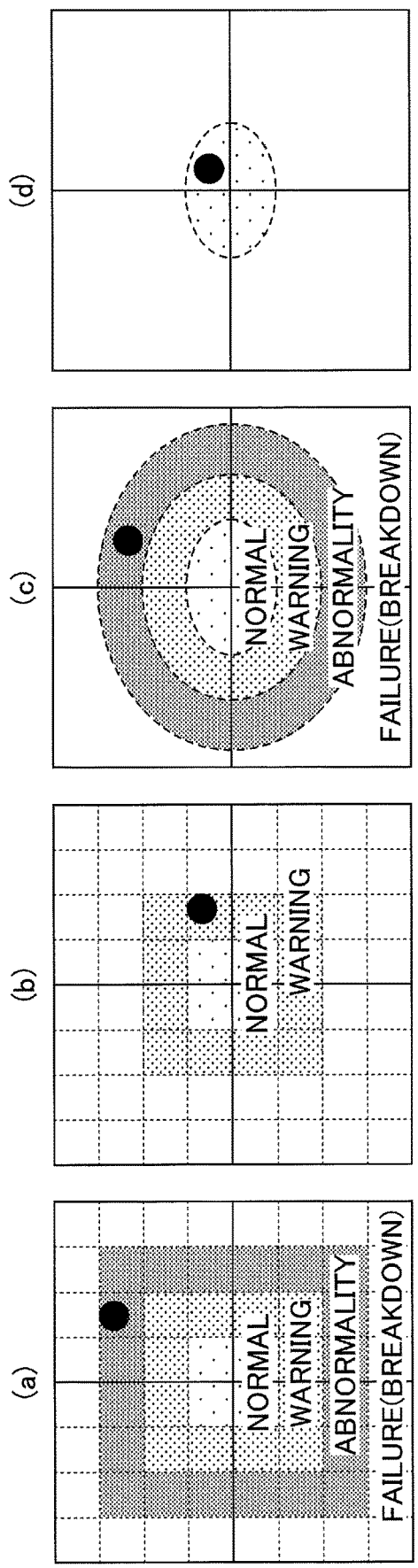
FIG. 22B is a second drawing illustrating a flow of cause determination processing performed by the cause identifying unit 55.
Figure 22C:
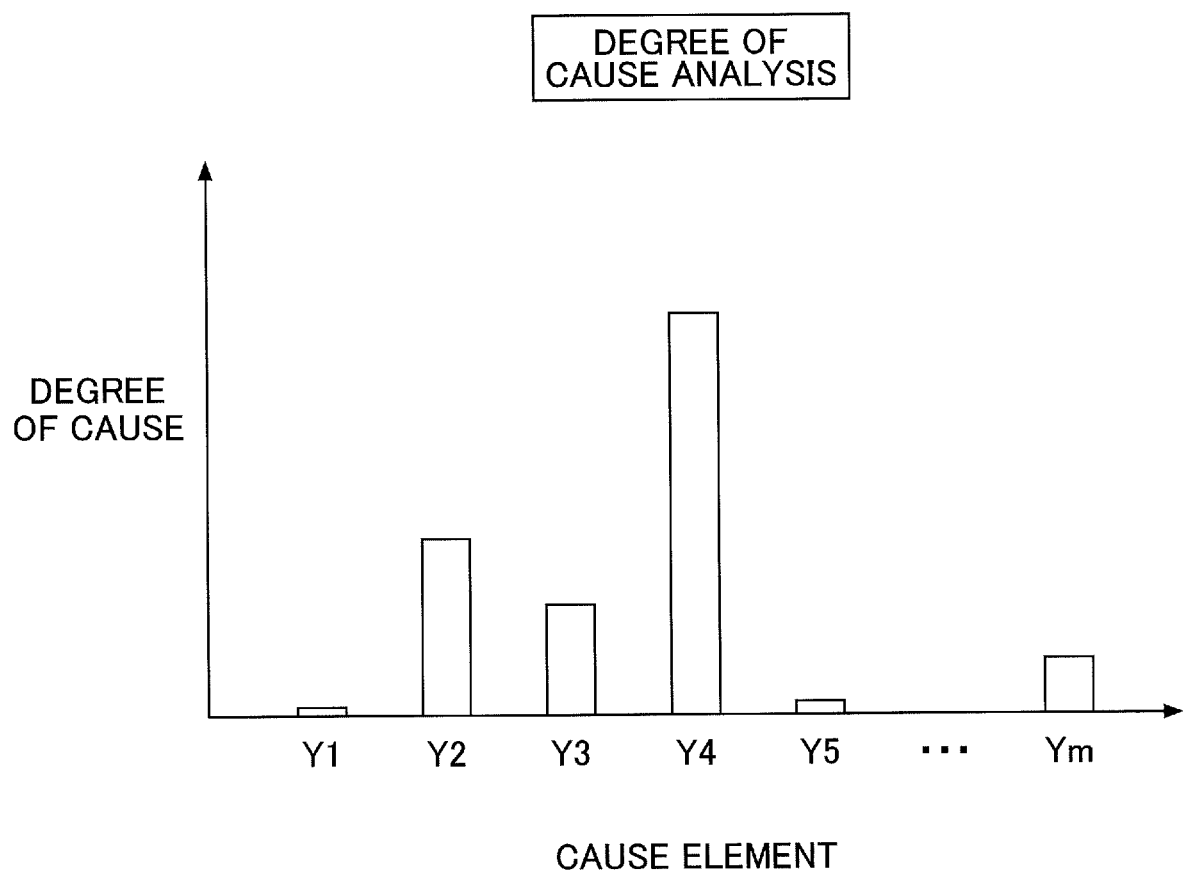
FIG. 22C is a third drawing illustrating a flow of cause determination processing performed by the cause identifying unit 55.

However, because the actual determination formula includes a large number of variables, formula (1) shows an example of the cause determination formula that includes only a few variables. FIG. 22A is a first drawing illustrating a flow of cause determination processing performed by the cause identifying unit 55. FIG. 22B is a second drawing illustrating a flow of cause determination processing performed by the cause identifying unit 55. FIG. 22C is a third drawing illustrating a flow of cause determination processing performed by the cause identifying unit 55.

In FIG. 22A, the flow of the cause determination formula is described. The various detections, control errors, and control corrections are input from the left to the right of FIG. 22, indicating the evaluation input data 45. Each of the analyses A, B, C, D, and E is performed, and Wn is multiplied for normalization according to each input and analysis, and components of X and Y are calculated for each analysis.

Then, as shown in FIG. 22B, the cause identifying unit 55 performs plotting in Cartesian coordinates for each detection and each analysis, and indicates a determination range indicating normal, warning, failure, or the like.

The cause identifying unit 55 calculates the distances (ZAn, ZBn, ZCn, ZDn, and ZEn) that deviates from the normal regions by the method shown in FIG. 19. The calculated distances (ZAn, ZBn, ZCn, ZDn, and ZEn) are multiplied by the mode parameters to construct the formula for each cause to be determined. Therefore, there exist many cause determination formulas, such as Y1 to Ym shown in FIG. 22A. In Ym, m is a natural number equal to or greater than one (1) and is the number of cause determinations. As shown in the histogram of the factor analysis in FIG. 22C, the cause identifying unit 55 calculates each of the analysis data items from Y1 to Ym and identifies causes using the factor of the vertical axis.

It should be noted that the cause determination formula is not limited to Formula (1), and the cause determination in the cause identifying unit 55 may use a formula other than Formula (1).

Cause Identifying Example

Figure 23A:
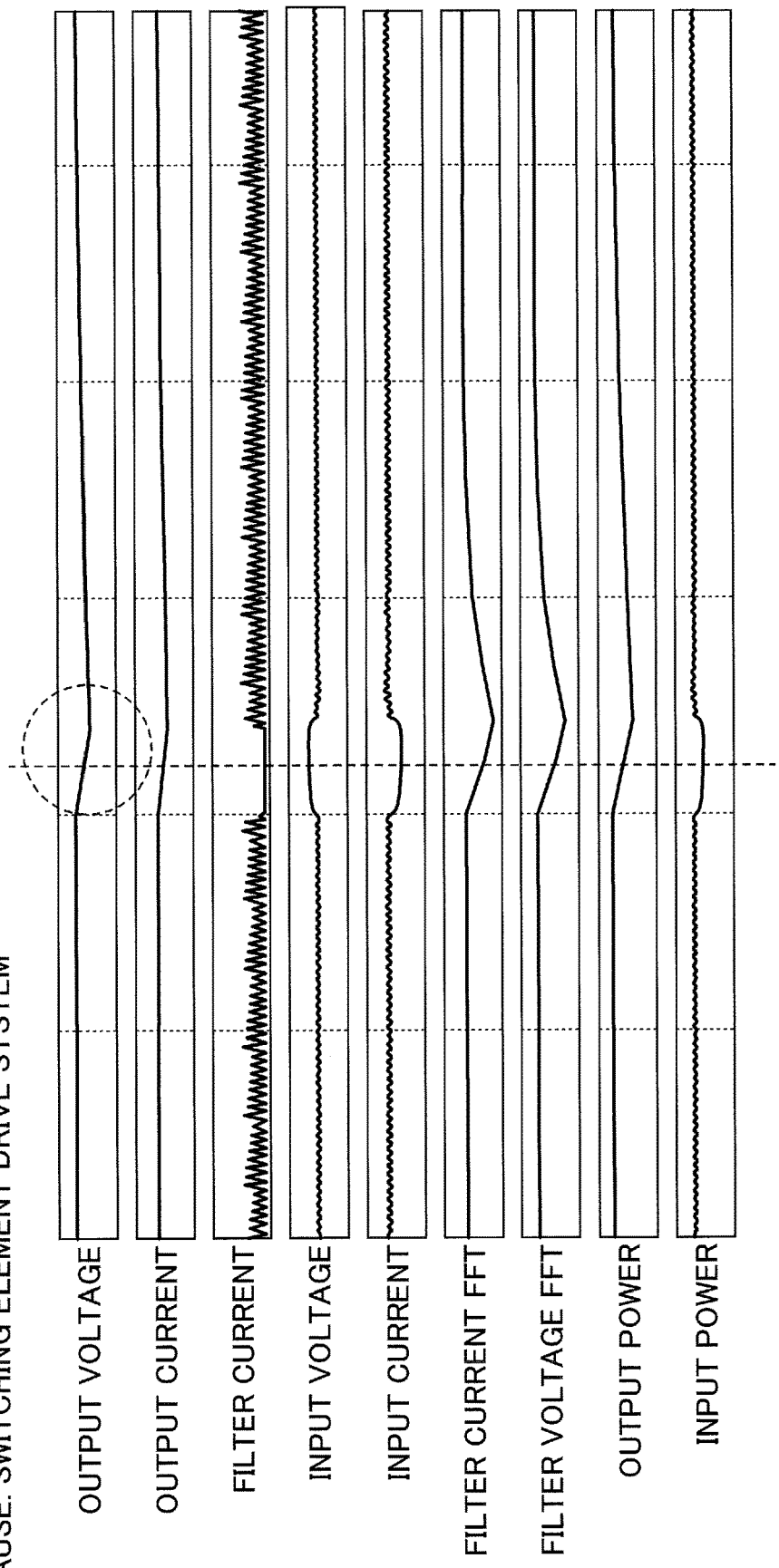
FIG. 23A is a first drawing illustrating waveforms in the case where a decreasing change occurs in an output voltage, using, as an example, a power converter controlling a direct current voltage to a constant value.
Figure 23C:
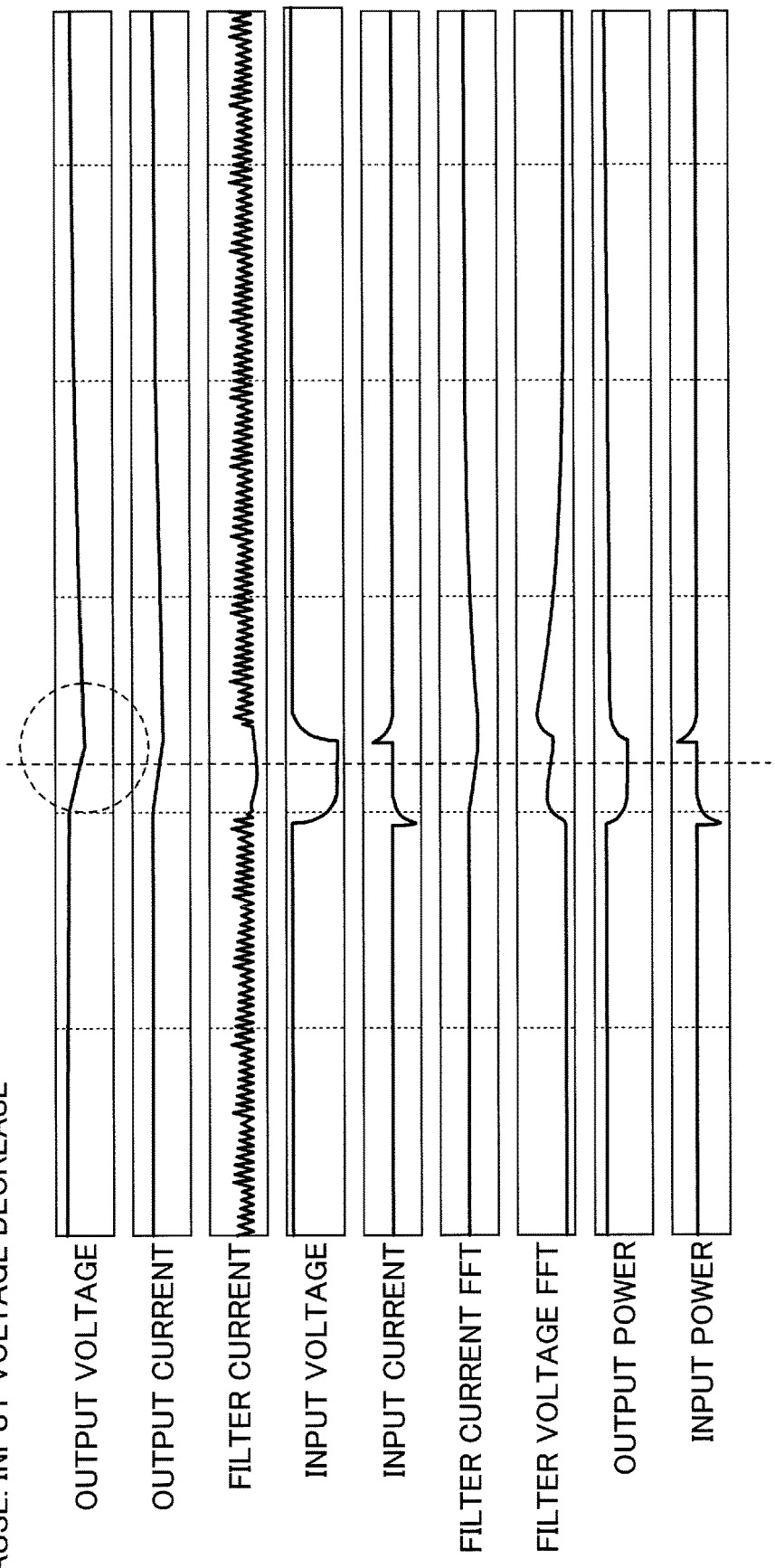
FIG. 23C is a third drawing illustrating waveforms in the case where a decreasing change occurs in an output voltage, using, as an example, a power converter controlling a direct current voltage to a constant value.

FIGS. 23A-23C and FIGS. 24A-24C illustrate examples of processing up to the cause determination formula. In an embodiment of the present invention, a case is described in which all weight factors are set to 1. FIG. 23A is a first drawing illustrating waveforms in the case where a decreasing change occurs in an output voltage, using, as an example, a power converter controlling a direct current (DC) voltage to a constant value. FIG. 23B is a second drawing illustrating waveforms in the case where a decreasing change occurs in an output voltage, using, as an example, a power converter controlling a direct current (DC) voltage to a constant value. FIG. 23C is a third drawing illustrating waveforms in the case where a decreasing change occurs in an output voltage, using, as an example, a power converter controlling a direct current (DC) voltage to a constant value. FIG. 24A is a first drawing illustrating a sequential flow of cause determination processing in the case where the change of the output voltage occurs as illustrated in FIGS. 23A-23C. FIG. 24B is a second drawing illustrating a sequential flow of cause determination processing in the case where the change of the output voltage occurs as illustrated in FIGS. 23A-23C. FIG. 24C is a third drawing illustrating a sequential flow of cause determination processing in the case where the change of the output voltage occurs as illustrated in FIGS. 23A-23C.

In FIG. 23A, a waveform is shown when an abnormality cause is caused by an abnormality of a switching element drive system. In FIG. 23B, a waveform is shown when an abnormality cause is caused by a load sudden change.

In FIG. 23C, a waveform is shown when an abnormality cause is caused by an input voltage sudden change (decrease) of the power converter. Values illustrated in FIGS. 23A-23C obtained by analyzing each data are plotted in Cartesian coordinates as shown in FIG. 24A. In FIG. 24A, data items are shown for the output voltage, the output current, the input voltage, the input current, FFT (e.g., FFT analysis result of filter voltage), and the power (e.g., output power of power converter) shown in FIGS. 23A-23C. A plot (1) is data of a switching element drive system. A plot (2) is data of a load system. A plot (3) is data of an input voltage system of the power converter.

The distance Z of each data shown in FIG. 24A is shown in the table below in FIG. 24B for each determination cause. Further, mode parameters for each determination cause in the cause determination formula at the time of the output voltage change are −1, 0, and 1 as shown in the upper table of FIG. 24B. These values are substituted into a cause determination formula shown in FIG. 24C, and calculated results of the cause determination formula are as shown in a table in FIG. 24C.

According to the table of FIG. 24C, in the determination formula of the switching element driving system, the calculation result at the time of abnormality of the switching element driving system is 11.5, which is equal to or greater than zero, so that the degree of cause is positive (Yes). However, when data Z at the time of abnormality of the load system is substituted into the determination formula, it becomes −20, and when data Z at the time of abnormality of the input voltage system is substituted into the determination formula, it becomes −10. In other words, the value is equal to or less than zero and is outside the cause (degree of cause is negative (No)). Substituting data Z at the time of abnormality of the load system means multiplying MB1 to MD1 of the switching element drive system by ZB1 to ZD1 of the load system. Substituting data Z at the time of abnormality of the input voltage system means multiplying MB1 to MD1 of the switching element drive system by ZB1 to ZD1 of the input voltage system.

Further, in the determination formula of the load system illustrated in the table of FIG. 24C, the calculation result at the time of abnormality of the load system is 6, which is equal to or greater than zero, so that the degree of cause is positive (Yes). However, when data Z at the time of abnormality of the switching element drive system is substituted into the determination formula, it becomes −29.5, and when data Z at the time of abnormality of the input voltage system is substituted into the determination formula, it becomes −10. In other words, the value is equal to or less than zero and is outside the cause (degree of cause is negative (No)).

Further, in the determination formula of the load system illustrated in the table of FIG. 24C, the calculation result at the time of abnormality of the load system is 6, which is equal to or greater than zero, so that the degree of cause is positive (Yes). However, when data Z at the time of abnormality of the switching element drive system is substituted into the determination formula, it becomes −6.5, and when data Z at the time of abnormality of the load system is substituted into the determination formula, it becomes −24. In other words, the value is equal to or less than zero and is outside the cause (degree of cause is negative (No)).

The result of the cause determination by the cause identifying unit 55 is associated with the date and time of the cause determination, and the associated result is recorded in the cause analysis data recording unit 59 and transmitted to the display unit 60 and the communication unit 61.

The display unit 60 is a display unit which indicates, to a user, an abnormality cause, or the like, based on the distance information 70, the abnormality level value 54, and the abnormality determination information 53.

In the display unit 60, the data determined to be abnormal is plotted in each quadrant and associated with the normal range and the level determination area, and is visually displayed in the form of Cartesian coordinates illustrated in FIG. 7, FIG. 10, FIG. 13, FIG. 15, FIG. 18, etc., for example. Further, the result of determination by the cause identifying unit 55 may be displayed in a message format on the display unit 60, for example.

Examples of the message in this case include: "It is highly likely that a large load has been applied at around month/date/hour/minute:mm/dd/hh/mm", "It is highly likely that the components in the power converter are deteriorating at around month/date/hour/minute:mm/dd/hh/mm"; and "It is likely that the live line work of the battery was performed at around month/date/hour/minute:mm/dd/hh/mm".

According the above arrangement, it is possible for a user to understand intuitively the abnormality cause, the time when the abnormality occurred, etc. Therefore, it becomes easy to identify an abnormality occurrence cause, and thus, it is possible to determine whether the abnormality occurred in the power converter 1, the power reception device 24, the load 22, or the bypass 25, and then take measures for recovery.

For example, even when an AC voltage fluctuation occurs due to an increase in the load 22 or when an AC voltage fluctuation occurs due to an instantaneous power failure of the power reception device 24, it is possible for a user to determine that the abnormality is not an abnormality of the power converter 1 by checking: the time when the power failure occurred; the abnormality cause (the determination result by the cause identifying unit 55), and the data that is determined to be abnormal, displayed on the display unit 60.

Further, because the data that is determined to be abnormal is displayed on the display unit 60 together with the level determination area, it is possible for a user to determine whether it is an event that needs to be immediately addressed or whether measures should be taken after monitoring for a while.

Accordingly, it is possible for a user to determine whether an abnormality caused by the power converter 1 has occurred or whether an abnormality caused by the external environment other than the power converter 1 has occurred and then consider recovery measures. Therefore, recovery measures can be taken optimally for each cause of the abnormality. As a result, it is possible to greatly reduce the time required for investigation of the recovery work and optimize the human resources required for the recovery work, thereby greatly reducing the man-hours required for the recovery work.

The communication unit 61 is a communication interface used for transmitting information such as an abnormality cause to the monitoring system based on the distance information 70, the abnormality level value 54, and the abnormality determination information 53.

By using the communication unit 61, even at a remote location away from a location where the power converter 1 is installed, information including an abnormality cause and a time when an abnormality occurs can be obtained. Therefore, the information recorded in the power converter 1 can be shared with the worker stationed at the remote location, and the recovery work can be performed smoothly. Further, when the communication unit 61 is not provided, it is troublesome to record the information recorded in the power converter 1 on a portable recording medium and pass it to the worker. However, when the communication unit 61 is used, this type of trouble is not generated and the cost required for the recovery work can be reduced.

The alarm unit 58 is a voice output unit that notifies that an abnormality has occurred based on the abnormality determination information 53. The method of notification by the alarm unit 58 may be an alarm sound or a voice guidance.

By using the alarm unit 58, it is possible for a user to understand the abnormality cause, the time when the abnormality occurred, etc., by checking the display 60 when the alarm sound is generated without constantly monitoring the abnormality in the display 60. Accordingly, it is possible to immediately understand that an abnormality has occurred and it is possible to prevent the information displayed on the display unit 60 from being overlooked.

Figure 20:
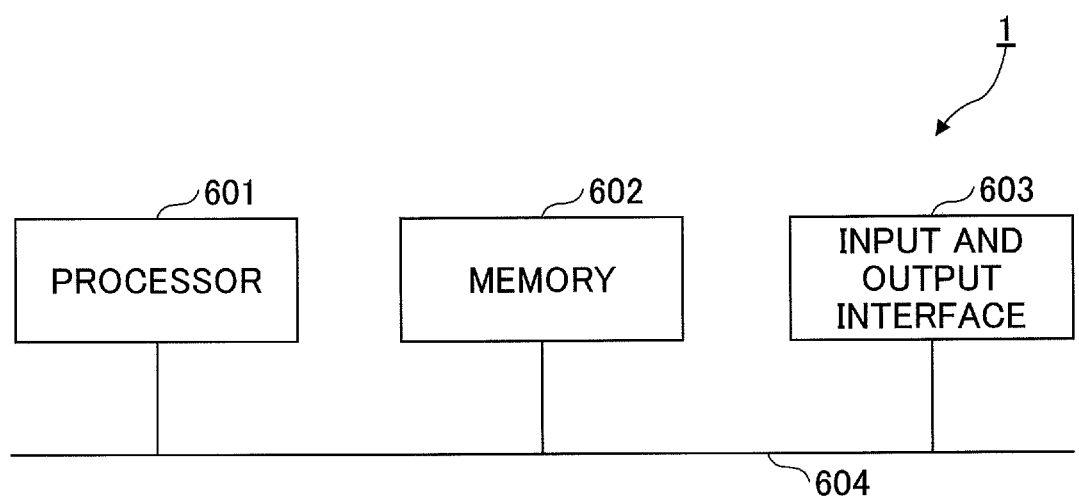
FIG. 20 is a drawing illustrating a hardware configuration example of a control unit 200 of a power converter 1 according to an embodiment of the present invention.

FIG. 20 is a drawing illustrating a hardware configuration example of a control unit 200 of the power converter 1 according to an embodiment of the present invention. The control unit 200 can be implemented by a processor 601, a memory 602 including RAM, ROM, or the like, and an input/output interface 603 for connecting the processor 601 to the alarm unit 58, the display unit 60, and the communication unit 61.

The processor 601, the memory 602, and the input/output interface 603 are connected to a bus 604 and are enabled to transmit or receive via the bus 604 the abnormality determination information 53, the abnormality level value 54, the distance information 70, the sensor detection value 64, and the like.

In the implementation of the power converter 1, a program for the control unit 200 is stored in the memory 602, and the program is executed by the processor 601 to realize the first analysis unit 48, the cause identifying unit 55, etc., of the control unit 200. The program for the control unit 200 is a program for executing functions such as the first analysis unit 48 and the cause identifying unit 55. The input/output interface 603 is used to transmit information between the alarm unit 58, the display unit 60, and the communication unit 61.

Patent Document 1 does not disclose a method for determining a disorder in an external environment or for determining a cause for a change in an operating state. In the related art, none of the abnormalities are analyzed rapidly within the power converter, and the abnormalities are analyzed by an external device (such as an abnormality diagnosis device) to which the power converter is connected. This is due to the large burden of principal component analysis in statistical calculations.

Because the power reception device 24 and the load 22 are connected to the power converter 1, various frequency components are generated in the AC operation mode, the DC operation mode, etc. In the related art, the abnormality is determined only by the waveform difference and the frequency component difference, so that it is difficult to identify an abnormality cause in the AC operation mode, the DC operation mode, or the like, and it is impossible to analyze the instantaneous abnormal event.

On the other hand, in an embodiment of the present embodiment, the abnormal event is quantified, the waveforms such as the voltage and the current at the time of the abnormality are recorded, and it is possible to analyze whether the cause of the abnormality is caused by the main body of the power converter 1 or by the external environment of the power converter 1. Therefore, it is possible to immediately take corrective measures for the cause of the abnormality.

In addition, by using the analysis history and waveforms at the time of an abnormality, it can be used to check the cause of the abnormality and to create a report on the cause of the abnormality.

In addition, by using the analysis history and waveforms at the time of an abnormality, for example, it is possible to adjust the abnormality determination value, so that it is possible to take measures of stopping the power converter 1 safely before the power converter 1 fails or before the abnormality/disorder affects the outside of the power converter 1.

Figure 21:
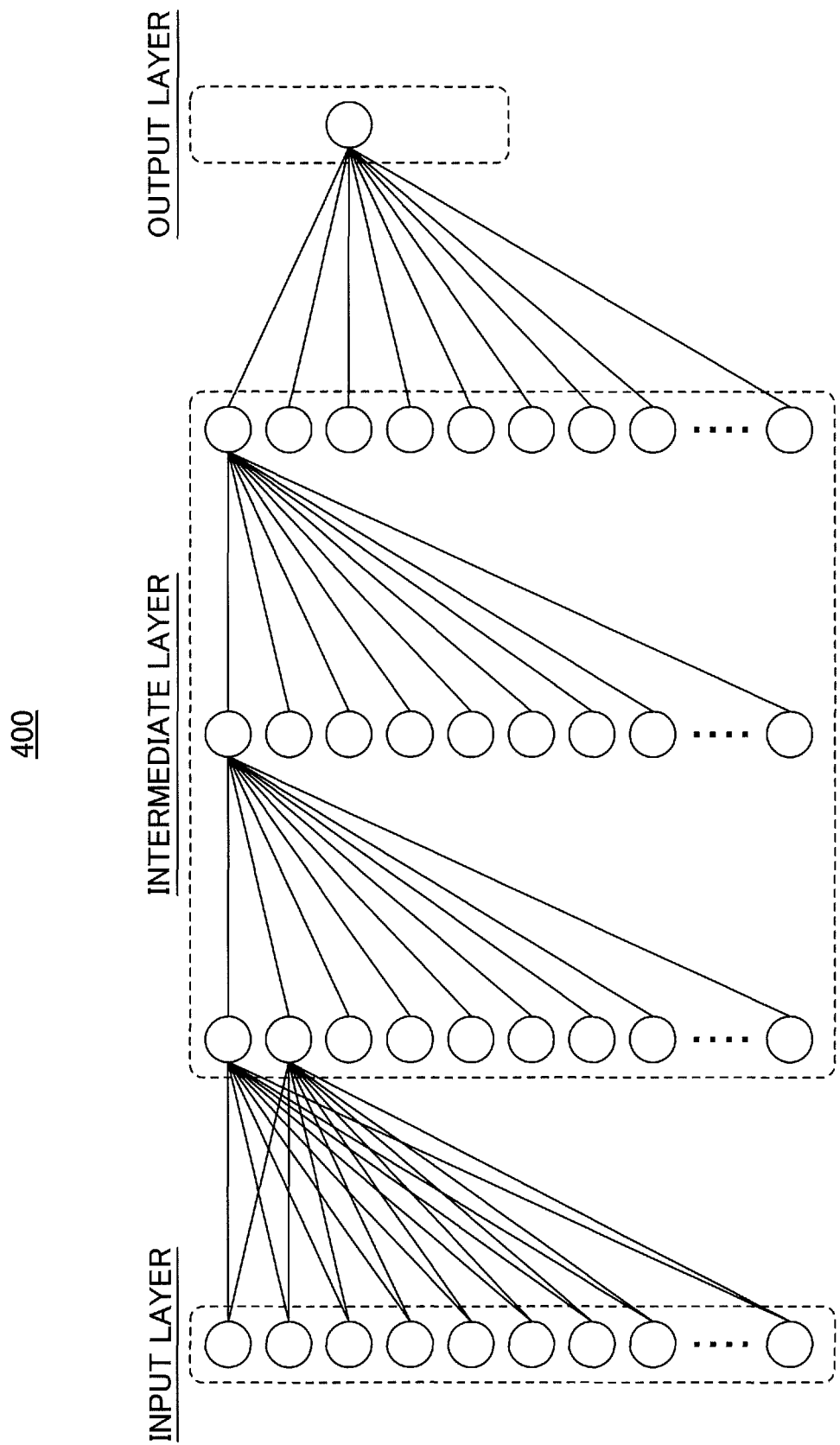
FIG. 21 is a drawing illustrating an example of a machine learning unit 400 applied to a cause identifying unit 55.

FIG. 21 is a drawing illustrating an example of a machine learning unit 400 applied to a cause identifying unit 55. The machine learning unit 400 learns, for example, a method of modifying parameters included in a determination formula for identifying a cause of an abnormality.

Machine learning is a technique for acquiring the learning ability like a human being in a computer. It is a technique in which a computer autonomously generates an algorithm necessary for determination including data identification, or the like, from the pre-loaded learning data, and then applies the algorithm to new data to make predictions. An example of a machine learning method is described below.
(Learning with teacher) A method for identifying data and deriving rules based on pre-determined samples (e.g., regression analysis, SVM (support vector machine)).
(Learning without teacher) A method of extracting essential structures and features of data by analyzing the actual data itself in the absence of sample data (e.g., k-Means, latent semantic indexes (LSIs), and topic modeling techniques (LDA)).
(Semi-Teacher Learning) is a method of learning using a small number of samples, then sorting out some actual data, and then re-learning the high-accuracy results as samples. (e.g., bootstrap, Adaboost) (Structural Learning) is a method of combining individual estimations without estimating data individually and optimizing the structure of the entire data. (e.g., structured SVM, conditional random field (CRF)).
(Strengthened Learning) is a technique in which no sample exists, but instead obtaining feedback information after learning provides additional learning clues. (e.g., Bandit algorithm, UCB algorithm).
(Deep Learning) A multi-layered, sophisticated approach that software mimics the structure of the human brain (neural network). (e.g., a restricted Boltzmann Machine, Category2Vec)

In FIG. 21, a machine learning unit 400 constructed, for example, of a neural network is illustrated.

The above machine learning methods may be any of learning with teacher, learning without teacher, semi-teacher learning, structural learning, reinforced learning, or deep learning, and may be a combination of these learning methods, the learning method of the machine learning is not limited.

When the cause identifying unit 55 is a machine-learned machine learning unit 400 using, for example, the mode parameters, the weight factors, or the bias value used for determining the abnormal factor, that are corrected by the user with respect to the parameters (mode parameters, weight factors, or the bias value) used for determination of the abnormality cause, values of the mode parameters, the weight factor, the bias value, or the like is automatically corrected to the optimum values, thereby significantly improving the accuracy of the determination of the abnormality cause.

As described above, the method of identifying an abnormality cause according to an embodiment of the present invention is a method of identifying an abnormality cause that is applied to a computer, wherein a value calculated based on a detection value detected by a power converter is plotted on Cartesian coordinates, it is determined whether or not the target data plotted on the Cartesian coordinates is within a determination area preset by a predetermined condition, and when it is determined that the value is outside the determination area, the cause of the abnormality is identified based on the quadrant of Cartesian coordinates where the target data is present.

According to the above arrangement, the data detected at the time of the abnormality is plotted at each quadrant of Cartesian coordinates, and the position of the data can be used to determine whether the abnormality is an abnormality occurring in the power converter or is due to the external environment of the power converter. In addition, it is possible to identify a cause of the abnormality that does not lead to the failure of the power converter. Accordingly, it is easy to identify a cause of the abnormality without incurring significant effort and cost.

The first analysis unit 48 is configured to plot a first value (B(k) in step S2) obtained by calculating a square of each of data items obtained by sampling the detected value at an interval and by calculating a summation of the calculated squares included in a time period and a second value (C(k) in step S5) obtained by calculating a square of each difference between adjacent sampled values at the interval and by calculating a summation of the calculated squares included in the time period, on Cartesian coordinates, to plot an average value of the first value on a zero point of the Cartesian coordinates, and to plot an average value of the second value on the zero point of the Cartesian coordinates.

According to the above arrangement, because an abnormality cause can be identified by a simple calculation such as a summation operation, even when a calculation circuit having a low processing capacity is used in the power converter, an abnormality cause can be identified. Thus, while suppressing the increase in the manufacturing cost of the power converter, it is possible to simplify the identification of the abnormality cause.

Further, the second analysis unit 49 is configured to plot a first value (X(k) in step S130) obtained by sampling the detection value, which is either a DC intermediate voltage, a DC current, and a DC voltage, at an interval, by calculating a deviation (ΔD(k) in step S120) between each of the sampled data items and a control command value, and by calculating a summation of the calculated deviations included in a time period, and a second value (Y(k) in step S140) obtained by calculating a difference between each of the adjacent deviations and by calculating a summation of the calculated differences.

According to the above arrangement, because an abnormality occurring in the external environment of the power converter can be identified by using a DC intermediate voltage, a DC current, a DC voltage, or the like, it is possible to easily separate whether an abnormality is occurring in the power converter or an abnormality is occurring in the external environment of the power converter.

Further, the third analysis unit 50 is configured to plot a result of the Fourier transform of a voltage value detected by the power converter (X(k) in step S220) and a result of the Fourier transform of a current value detected by the power converter (Y(k) in step S240) in Cartesian coordinates.

According to the above arrangement, for example, for an event in which it is difficult to detect simply by comparing the level of the AC waveform with the threshold value for determining the abnormality, a FFT analysis can determine various abnormality causes such as a capacitor abnormality, a reactor abnormality, and a switching element abnormality as shown in FIG. 12.

The fourth analysis unit 51 is configured to plot an AC output power detected by the power converter in the first direction (for example, the X-axis positive direction) on the first coordinate axis of the Cartesian coordinates, plot an AC input power detected by the power converter in the second direction (for example, the X-axis negative direction) on the first coordinate axis of the Cartesian coordinates, plot a discharge power in the first direction (for example, the Y-axis positive direction) on the second coordinate axis orthogonal to the first coordinate axis, and plot the charging power in the second direction (for example, the Y-axis negative direction) on the second coordinate axis.

According to the above arrangement, when charging operations, alternating current (AC) operations, input limited operations, direct current (DC) operations, etc., are performed, it is possible to detect a direct current (DC) short circuit, a battery abnormality, an inverter abnormality, etc., by analyzing the direction and the level of the power flowing in the power converter 1.

The fifth analysis unit 52 is configured to: calculate a first value (L(k) in step S420), which is obtained by sampling an alternating current (AC) input current or an alternating current (AC) output current detected by the power converter, by calculating a square of each of the sampled data, and by calculating a summation of the calculated squares; calculate a second value (M(k) in step S450), which is obtained by calculating a difference of adjacent sampled data items, by calculating a square of each of the differences, and by calculating a summation of the calculated squares; plot a difference between an average value of a plurality of the first values and the first value in a direction of the first coordinate axis of the Cartesian coordinates; and plot a value, in which the second value is divided by the first value, in a direction of the second coordinate axis orthogonal to the first coordinate axis of the Cartesian coordinates.

According to the above arrangement, it is possible to identify whether the abnormality cause is caused by a failure of the load 22, an increase or decrease of the power supplied to the load 22, or the like.

Further, the functions (the method of identifying an abnormality cause) of the abnormality determining unit 80 and the cause identifying unit 55 according to an embodiment of the present invention may be realized by a device other than the power converter 1 (an abnormality cause identifying device). The device may be a server, a personal computer, a tablet terminal, a smartphone, a notebook PC, or the like to perform various functions by installing various programs. In this case, a program for executing the functions of the abnormality determination unit 80 and the cause identifying unit 55 is stored in a memory of the abnormality cause identifying device, and the program is executed by a processor of the abnormality cause identifying device. Thus, the abnormality determination unit 80 and the cause identifying unit 55 are realized.

Figure 25:
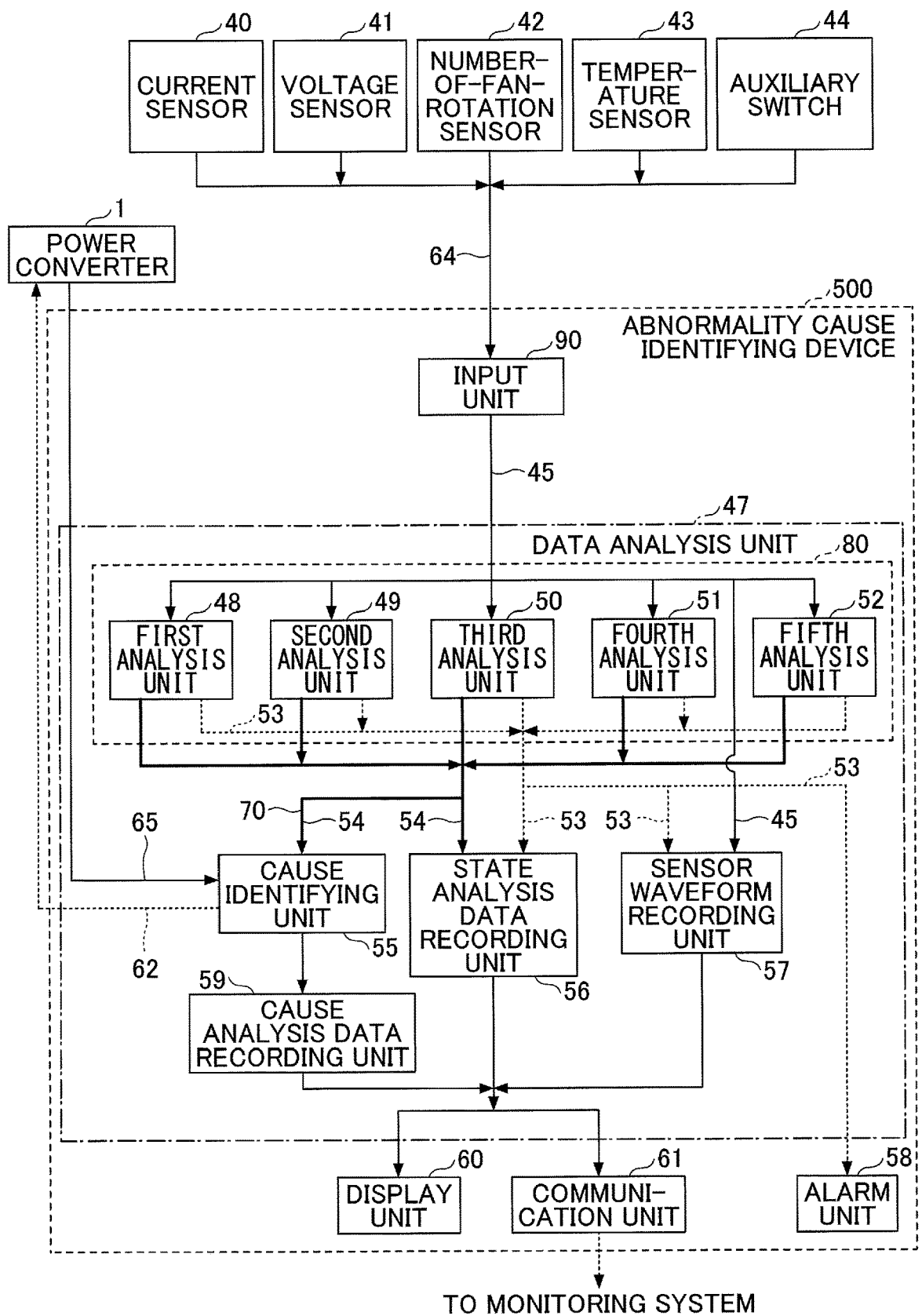
FIG. 25 is a drawing illustrating a configuration example of an abnormality cause identifying apparatus 500 according to an embodiment of the present invention.

FIG. 25 is a drawing illustrating a configuration example of an abnormality cause identifying device 500 according to an embodiment of the present invention. Hereinafter, the abnormality cause identifying device 500 includes an input unit 90, a data analysis unit 47, a display unit 60, a communication unit 61, and an alarm unit 58. According to the abnormality cause identifying device 500, a tablet terminal, a smartphone, a notebook PC, or the like can be used to identify the cause of the abnormality.

Figure 26:
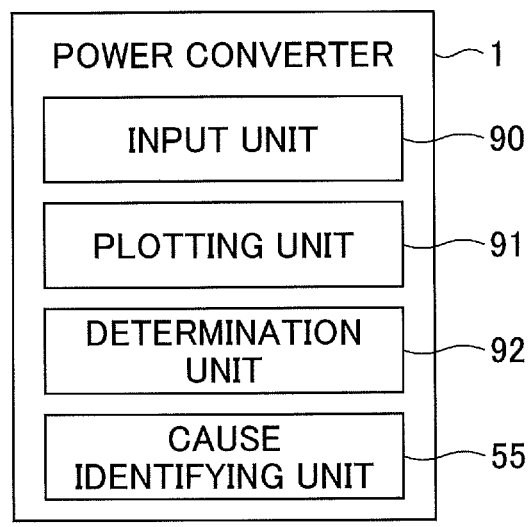
FIG. 26 is a functional block diagram of the power converter 1.

FIG. 26 is a functional block diagram of the power converter 1. The power converter 1 includes an input unit 90 for inputting a detection value detected by the power converter 1, a plotting unit 91 for plotting a value calculated on the basis of the detection value on Cartesian coordinates, a determining unit 92 for determining whether or not the target data plotted on the Cartesian coordinates is within a determination area preset in accordance with a predetermined condition, and a cause identifying unit 55 for identifying a cause of an abnormality based on a quadrant of the Cartesian coordinates where the target data is present when the value is determined to be outside the determination area. According to the above arrangement, it is possible to identify the abnormality cause simply by adding a function to the power converter 1, and thus the configuration of the power conversion system can be simplified.

Figure 27:
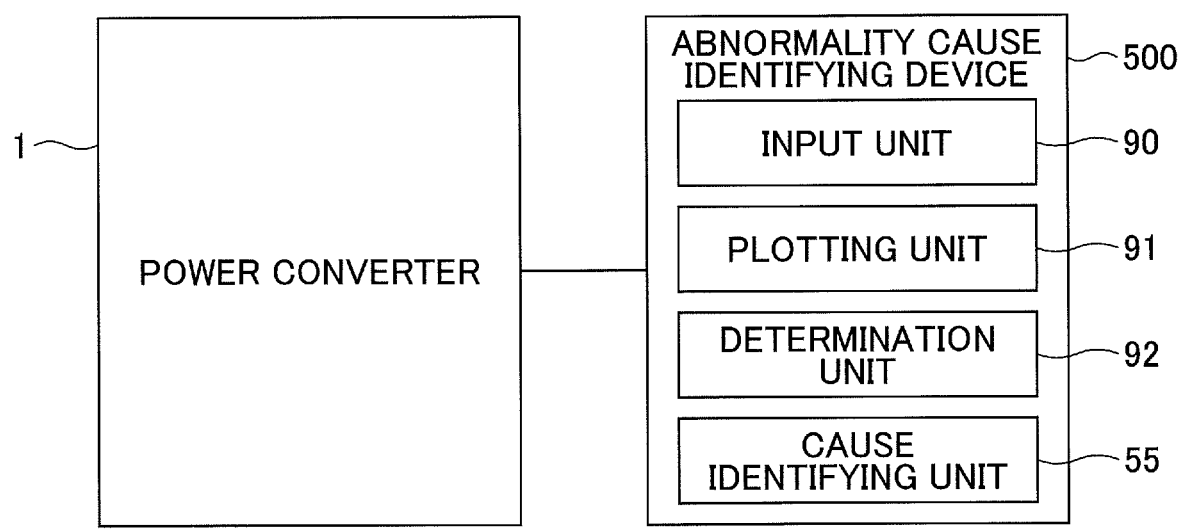
FIG. 27 is a functional block diagram of the abnormality cause identifying apparatus 500.

FIG. 27 is a functional block diagram of the abnormality cause identifying device 500. The power converter 500 includes an input unit 90 for inputting a detection value detected by the power converter 1, a plotting unit 91 for plotting a value calculated on the basis of the detection value on Cartesian coordinates, a determining unit 92 for determining whether or not the target data plotted on the Cartesian coordinates is within a determination area preset in accordance with a predetermined condition, and a cause identifying unit 55 for identifying a cause of an abnormality based on a quadrant of the Cartesian coordinates where the target data is present when the value is determined to be outside the determination area. According to the above arrangement, it is possible to identify the cause of the abnormality by using a terminal device other than the power converter 1 without adding a function to the power converter 1.

The power conversion system 300 may be configured to display an abnormality cause in either of the abnormality cause identifying device 500 and the power converter 1. Further, the power conversion system 300 may display the result (the result of identifying the abnormality cause) of the abnormality cause identifying device 500 to a terminal via a network.

The abnormality cause identifying device, which is an abnormality cause identifying device for identifying an abnormality of a power converter that converts power supplied from a power supply and supplies the converted power to a load, may be configured to include an operation mode control adjustment unit that outputs a control parameter calculated based on a detection value detected from the power converter, a data analysis unit that plots a value calculated using the detection value and the control parameter on coordinates with at least two axes, and an identifying unit that identifies an abnormality cause based on a quadrant of the coordinates on which the value is plotted. The control parameters are the control deviation 33 and the control adjustment data 39 input to the data analysis unit 47 from the operation mode control adjustment unit 46. The control deviation 33, the control adjustment data 39, and the digital data of the detection values detected from the power converter are input to the data analysis unit.

Further, the data analysis unit of the abnormality cause identifying device may be configured to determine that the plotted value is abnormal when the plotted value exceeds a predetermined range.

Further, when the plotted value exceeds a predetermined range, the data analysis unit of the abnormality cause identifying device calculates a distance indicating how much the plotted value deviates from the predetermined range and outputs the calculated distance to the identifying unit. The operation mode control adjustment unit outputs operation mode information indicating an operation state of the power converter determined based on the detection value to the identifying unit. The identifying unit may select, in addition to the operation mode information, an operation mode parameter corresponding to any of abnormality events, and identify an abnormality cause based on the operation mode parameter, the vector value, and a preset weight factor.

In addition, the identifying unit of the abnormality cause identifying device may be configured to multiply the operation mode parameter by the weight factor, subtract the bias value to prevent the erroneous determination of the abnormality cause from the multiplied value, and identify the abnormal event corresponding to the largest value among the values exceeding zero as the cause of the abnormality when the value after subtraction exceeds zero.

The data analysis unit may be configured to include a first analysis unit that applies a sampling process to the detection value at a constant interval, a first value generation unit that generates a first value by calculating a square of each sampled value and by calculating a summation of the squares included in a constant time period, a second value generation unit that generates a second value by calculating a square of each difference between adjacent sampled values at the constant interval and by calculating a summation of the squares included in a constant time period, and a first plotting unit that plots the first value and the second value on the coordinates.

The data analysis unit may be configured to include a sampling unit that applies a sampling process to the detection value at a constant interval, a third value generation unit that generates a third value by calculating a deviation of each sampled value from the control parameter and by calculating a summation of the deviations included in a constant time period, a fourth value generation unit that generates a fourth value by calculating each difference between adjacent deviations at the constant interval and by calculating a summation of the differences in a constant time period, and a second plotting unit that plots the third value and the fourth value on the coordinates.

The data analysis unit may be configured to include a third analysis unit that includes a fifth value generation unit that calculates a fifth value by applying Fourier transformation to a voltage value detected by the power converter, a sixth value generation unit that calculates a sixth value by applying Fourier transformation to a current value detected by the power converter, and a third plotting unit that plots the fifth value and the sixth value on the coordinates.

The data analysis unit may be configured to include a fourth analysis unit that includes a seventh value generation unit that generates a seventh value by using an alternating current (AC) output power detected by the power converter, an eighth value generation unit that generates an eighth value by using charging and discharging power from a chopper unit included in the power converter, and a fourth plotting unit that plots the seventh value and the eighth value on the coordinates.

The data analysis unit may be configured to include a fifth analysis unit that includes a sampling unit that applies sampling processing to the detection value at a constant interval, a tenth value generation unit that generates a tenth value by calculating a square of each sampled value, by calculating a summation of the squares included in a constant time period to calculate a ninth value, and by calculating, as the tenth value, a difference between the ninth value and an average of the ninth value, a twelfth value generation unit that generates a twelfth value by calculating a square of each difference between adjacent sampled values at the constant interval, by calculating a summation of the squares included in a constant time period to calculate an eleventh value, and by calculating a ratio between the eleventh value and the ninth value as the twelfth value, and a fifth plotting unit that plots the tenth value and the twelfth value on the coordinates.

The first plotting unit may be configured to plot an average value of each of the first value and the second value to be a zero point of the coordinates.

The third plotting unit may be configured to plot an average value of each of the fifth value and the sixth value to be a zero point of the coordinates.

The identifying unit may be configured to further include a machine learning unit that learns how to modify the weight factor.

The arrangements shown in the above-described embodiments are examples of the contents of the present invention, and they can be combined with another known art, or part of the arrangements can be omitted or changed without departing from the subject matter of the present invention.

This application is based upon and claims priority to Japanese Patent Application No. 2019-023035 filed on Feb. 12, 2019, and the entire content of Japanese Patent Application No. 2019-023035 is incorporated herein by reference.

What is claimed is:

1. An abnormality cause identifying method that is applied to a computer, the abnormality cause identifying method comprising:
   outputting a control parameter that is calculated based on a detection value detected from a power converter that converts power supplied from a power supply and supplies the converted power to a load where in the power convert includes a rectifier, a chopper and an inverter;
   plotting, on coordinates having at least two axes, a value that is calculated using the detection value and the control parameter;
   identifying an abnormality cause based on a quadrant of the coordinates on which the value is plotted,
   wherein the identifying includes:
      determining whether target data plotted on the coordinates is within a determination area preset according to a predetermined condition;
      calculating a vector value based on each of an X-axis component value of the value and a Y-axis component value of the value in the case where the value is out of the determination area;
      multiplying the vector value with
         a normalization parameter to normalize the value,
         a mode parameter determined by any of an operation state and an abnormal event of the power converter, and
         a weight factor;

subtracting a bias value used for preventing an incorrect determination of an abnormality cause from the multiplied value;

automatically correcting the mode parameter, weight factor, and the bias value by a processor that is configured to run a trained neural network that is trained by the mode parameter, weight factor, and the bias value that are adjusted by a user, and identifying, by the trained neural network, as the abnormality cause, an abnormal event corresponding to a greatest value among values exceeding zero in the case where the subtracted value exceeds zero, and generating a message including at least one of the abnormality cause or the time when the abnormal event occurred and causing a terminal that is connected via network to display the message.

2. The abnormality cause identifying method according to claim 1, further comprising:

applying a sampling process at a constant interval to the value that is calculated based on the detection value and the control parameter to obtain sampled values;

generating a first value obtained by calculating a square of each of the sampled values and by calculating a summation of the calculated squares included in a constant time period;

generating a second value obtained by calculating a square of each difference between consecutive sampled values at the constant interval and by calculating a summation of the calculated squares included in the constant time period; and plotting the first value and the second value on the coordinates.

3. The abnormality cause identifying method according to claim 2, further comprising:

applying a sampling process to the detection value at a constant interval to obtain sampled values, generating a third value obtained by calculating a deviation of each of the sampled values from the control parameter and by calculating a summation of the deviations included in a constant time period; and generating a fourth value obtained by calculating each difference between consecutive calculated deviations at the constant interval and by calculating a summation of the calculated differences included in the constant time period; and plotting the third value and the fourth value on the coordinates.

4. The abnormality cause identifying method according to claim 3, further comprising:

calculating a fifth value by applying Fourier transformation to a voltage value detected by the power converter;

calculating a sixth value by applying Fourier transformation to a current value detected by the power converter;

plotting the fifth value and the sixth value on the coordinates.

5. The abnormality cause identifying method according to claim 4, further comprising:

generating a seventh value using an alternating current (AC) output power detected by the power converter;

generating an eighth value using a charge and discharge power from a chopper unit included in the power converter;

plotting the seventh value and the eighth value on the coordinates.

6. The abnormality cause identifying method according to claim 5, further comprising:

applying a sampling process to the detection value at a constant interval to obtain sampled values;

generating a tenth value by calculating a square of each of the sampled values, by calculating, as a ninth value, a summation of the calculated squares included in a constant time period, and by calculating, as the tenth value, a difference between the ninth value and an average value of the ninth value;

generating a twelfth value by calculating a square of each difference between consecutive sampled values at the constant interval, by calculating, as an eleventh value, a summation of the calculated squares included in the constant time period, and by calculating, as the twelfth value, a ratio between the eleventh value and the ninth value; and plotting the tenth value and the twelfth value on the coordinates.

7. The abnormality cause identifying method according to claim 4, further comprising:

performing plotting in such a way that an average value calculated using the detection value and the control parameter is plotted at a zero point of the coordinates.

8. An abnormality cause identifying device for identifying an abnormality of a power converter that converts power supplied from a power supply and supplies the converted power to a load, the power converter including a rectifier, a chopper and an inverter, the abnormality cause identifying device comprising:

an operation mode control adjustment unit configured to output a control parameter calculated based on a detection value detected from the power converter;

a data analysis unit configured to plot, on coordinates having at least two axes, a value that is calculated using the detection value and the control parameter; and an identifying unit configured to identify an abnormality cause based on a quadrant of the coordinates on which the value is plotted, wherein the data analysis unit determines that an abnormality has occurred in the case where the plotted value exceeds a predetermined range, the data analysis unit calculates a distance indicating how far the plotted value deviates from a predetermined range in the case where the plotted value exceeds the predetermined range, and outputs the calculated distance to the identifying unit, the operation mode control adjustment unit outputs an operation mode information indicating an operation state of the power converter determined based on the detection value, the identifying unit selects an operation mode parameter corresponding to any of abnormal events in addition to the operation mode information, and identifies an abnormality cause based on the operation mode parameter, the vector value and a preset weight factor, and the identifying unit multiplies the operation mode parameter by the weight factor, subtracts a bias value used for preventing an incorrect determination of an abnormality cause from the multiplied value, and run a trained neural network that is trained by the mode parameter, weight factor, and the bias value that are adjusted by a user so as to automatically correct the mode parameter, the weight factor, and the bias value and identify an abnormal event corresponding to a largest value among values exceeding zero as an abnormality cause in the case where the subtracted value exceeds zero, and wherein the identifying unit is further configured to generate a message including at least one of the abnormality cause or the time when the abnormal event occurred and cause a terminal that is connected via network to display the message, and the operation mode control adjustment unit is further configured to control the rectifier, the chopper and the inverter to stop their operations upon identifying the abnormality cause.

9. The abnormality cause identifying device according to claim 8, wherein the data analysis unit includes a first analysis unit that includes a sampling unit for applying a sampling process to the detection value at a constant interval to obtain sampled values, a first value generation unit for generating a first value obtained by calculating a square of each of the sampled values and by calculating a summation of the calculated squares included in a constant time period, a second value generation unit for generating a second value obtained by calculating a square of each difference between consecutive sampled values at the constant interval and by calculating a summation of the calculated squares included in the constant time period, and a first plotting unit for plotting the first value and the second value on the coordinates.

10. The abnormality cause identifying device according to claim 9, wherein the data analysis unit includes a second analysis unit that includes a sampling unit for applying a sampling process to the detection value at a constant interval to obtain sampled values, a third value generation unit for generating a third value obtained by calculating a deviation of each of the sampled values from the control parameter and by calculating a summation of the deviations included in a constant time period, a fourth value generation unit for generating a fourth value obtained by calculating a difference of each of the deviations at the constant interval and by calculating a summation of the calculated differences included in the constant time period, and a second plotting unit for plotting the third value and the fourth value on the coordinates.

11. The abnormality cause identifying device according to claim 10, wherein the data analysis unit includes a third analysis unit that includes a fifth value generation unit for calculating a fifth value by applying Fourier transformation to a voltage value detected by the power converter;

a sixth value generation unit for calculating a sixth value by applying Fourier transformation to a current value detected by the power converter; and a third plotting unit for plotting the fifth value and the sixth value on the coordinates.

12. The abnormality cause identifying device according to claim 11, wherein the data analysis unit includes a fourth analysis unit that includes a seventh value generation unit for generating a seventh value using an alternating current (AC) output power detected by the power converter, an eighth value generation unit for generating an eighth value using a charge and discharge power from a chopper unit included in the power converter, and a fourth plotting unit for plotting the seventh value and the eighth value on the coordinates.

13. The abnormality cause identifying device according to claim 12, wherein the data analysis unit includes a fifth analysis unit that includes a sampling unit for applying a sampling process to the detection value at a constant interval to obtain sampled values, a tenth value generation unit for generating a tenth value obtained by calculating a square of each of the sampled values, by calculating, as a ninth value, a summation of the calculated squares included in a constant time period, and by calculating a difference between the ninth value and an average value of the ninth value, an twelfth value generation unit for generating a twelfth value obtained by calculating a square of each difference between consecutive sampled values at the constant interval, by calculating a summation of the calculated squares as an eleventh value, and by calculating a ratio between the eleventh value and the ninth value, and a fifth plotting unit for plotting the tenth value and the twelfth value on the coordinates.

14. The abnormality cause identifying device according to claim 9, wherein the first plotting unit performs plotting in such a way that an average value of each of the first value and the second value is a zero point of the coordinates.

15. The abnormality cause identifying device according to claim 11, wherein the third plotting unit performs plotting in such a way that an average value of each of the fifth value and the sixth value is a zero point of the coordinates.

16. The abnormality cause identifying device according to claim 8, wherein the identifying unit further includes a machine learning unit for learning a modifying method of the weight factor.

17. A power converter including a display unit that displays a result of the abnormality cause identifying device according to claim 8.

18. A power conversion system including the power converter according to claim 17, wherein the result of the abnormality cause identifying device is displayed on a terminal via a network.

19. The abnormality cause identifying method according to claim 1, further comprising: controlling the rectifier, the chopper and the inverter to stop their operations upon identifying the abnormality cause.

* * * * *